US012700566B2

(12) United States Patent
Wieland

(10) Patent No.: US 12,700,566 B2
(45) Date of Patent: Aug. 4, 2026

(54) OBJECTIVE LENS ARRAY ASSEMBLY, ELECTRON-OPTICAL SYSTEM, ELECTRON-OPTICAL SYSTEM ARRAY, METHOD OF FOCUSING

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 512 days.

(21) Appl. No.: 18/316,169

(22) Filed: May 11, 2023

(65) Prior Publication Data

US 2023/0290609 A1 Sep. 14, 2023

Related U.S. Application Data

(63) Continuation of application No. PCT/EP2021/080509, filed on Nov. 3, 2021.

(30) Foreign Application Priority Data

Nov. 12, 2020 (EP) .................................... 20207178
Mar. 31, 2021 (EP) .................................... 21166214
Aug. 17, 2021 (EP) .................................... 21191726

(51) Int. Cl.
*H01J 37/317* (2006.01)
(52) U.S. Cl.
CPC ... *H01J 37/3177* (2013.01); *H01J 2237/0453* (2013.01); *H01J 2237/04926* (2013.01); *H01J 2237/1534* (2013.01)

(58) Field of Classification Search
CPC .. H01J 37/00; H01J 37/02; H01J 37/12; H01J 37/153; H01J 37/26; H01J 37/28;
(Continued)

(56) References Cited

U.S. PATENT DOCUMENTS

2006/0289804 A1* 12/2006 Knippelmeyer ....... B82Y 10/00
250/492.22
2008/0023643 A1* 1/2008 Kruit ...................... H01J 37/12
250/396 R
(Continued)

FOREIGN PATENT DOCUMENTS

EP 1602121 A2 12/2005
EP 2425444 A1 3/2012
(Continued)

OTHER PUBLICATIONS

Yanxia Zhang, P. Kruit; "Design of a high brightness multi-electron-beam source," ScienceDirect; Physics Procedia 2008; pp. 553-563 (11 pgs.).
(Continued)

*Primary Examiner* — Jason L McCormack
(74) *Attorney, Agent, or Firm* — FINNEGAN, HENDERSON, FARABOW, GARRETT & DUNNER, LLP

(57) ABSTRACT
Objective lens array assemblies and associated methods are disclosed. In one arrangement, the objective lens array assembly focuses a multi-beam of sub-beams on a sample. Planar elements define a plurality of apertures aligned along sub-beam paths. An objective lens array projects the multi-beam towards a sample. Apertures of one or more of the planar elements compensate for off-axis aberrations in the multi-beam.

18 Claims, 15 Drawing Sheets

(58) Field of Classification Search
CPC ........... H01J 37/3177; H01J 2237/0453; H01J 2237/04926; H01J 2237/1205; H01J 2237/1532; H01J 2237/1534
USPC .......................................... 250/306, 307, 311
See application file for complete search history.

(56) References Cited

U.S. PATENT DOCUMENTS

| | | | |
|---|---|---|---|
| 2009/0212213 A1* | 8/2009 | Nakasuji ................. | H01J 37/28 250/442.11 |
| 2011/0068276 A1 | 3/2011 | Kruit et al. | |
| 2012/0123581 A1 | 5/2012 | Smilde et al. | |
| 2013/0248731 A1 | 9/2013 | Tanimoto et al. | |
| 2014/0158902 A1 | 6/2014 | Knippelmeyer et al. | |
| 2017/0243717 A1 | 8/2017 | Kruit | |
| 2017/0304878 A1 | 10/2017 | Smits et al. | |
| 2019/0013176 A1* | 1/2019 | Breuer .................... | H01J 37/10 |
| 2019/0107781 A1 | 4/2019 | Tinnemans et al. | |
| 2020/0273667 A1 | 8/2020 | Mohammadi-Gheidari et al. | |
| 2020/0286704 A1 | 9/2020 | Inoue et al. | |

FOREIGN PATENT DOCUMENTS

| | | | |
|---|---|---|---|
| EP | 2575143 | A1 | 4/2013 |
| EP | 2702595 | A1 | 3/2014 |
| EP | 2715768 | A2 | 4/2014 |
| EP | 3863040 | A1 | 2/2020 |
| EP | 3869535 | A1 | 2/2020 |
| EP | 3937204 | A1 | 7/2020 |
| EP | 3937205 | A1 | 7/2020 |
| JP | 60031225 | A | 2/1985 |
| JP | 2007513460 | A | 5/2007 |
| JP | 2009545118 | A | 12/2009 |
| JP | 2013505575 | A | 2/2013 |
| JP | 2013196951 | A | 9/2013 |
| TW | 202020918 | A | 6/2020 |
| WO | WO 2005/024881 | A2 | 3/2005 |
| WO | WO 2005/024881 | A3 | 3/2005 |
| WO | WO 2008/013442 | A1 | 1/2008 |

OTHER PUBLICATIONS

Disclosed Anonymously, "Correcting LS finite spot size and CWE effects for correct ERP measurement," Research Disclosure, Nov. 2016, database No. 631045, ISSN 0374-4353.

* cited by examiner

Fig. 10
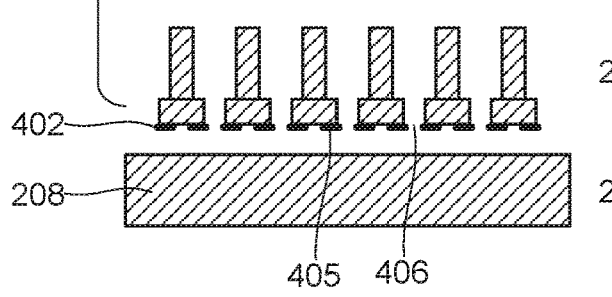
30kV
401
2.55kV
402
208     2.5kV
405   406
Fig. 11
402
404
405
406
Fig. 12
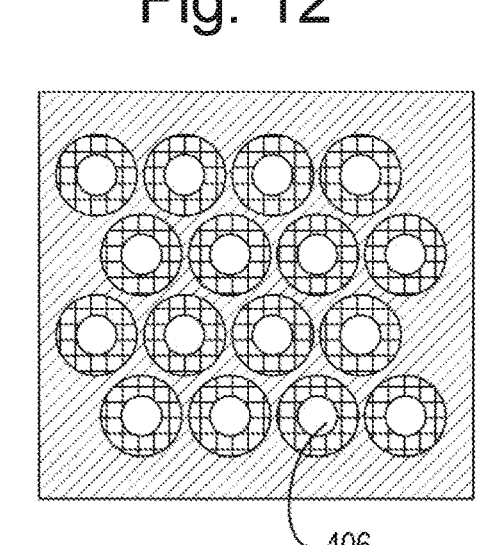
406
Fig. 13
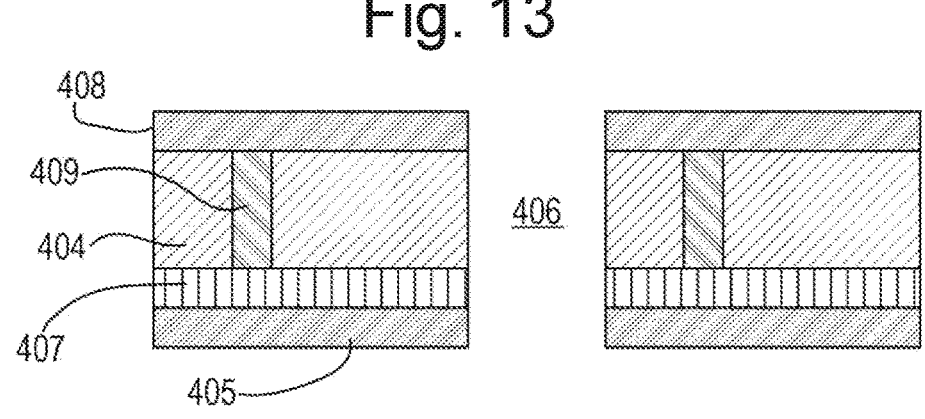
408
409
404
407
405
406

OBJECTIVE LENS ARRAY ASSEMBLY, ELECTRON-OPTICAL SYSTEM, ELECTRON-OPTICAL SYSTEM ARRAY, METHOD OF FOCUSING

CROSS-REFERENCE TO RELATED APPLICATIONS

This application claims priority of International application PCT/EP2021/080509, filed on 3 Nov. 2021, which claims priority of EP application 20207178.3, filed on 12 Nov. 2020, of EP application 21166214.3, filed on 31 Mar. 2021, and of EP application 21191726.5, filed on 17 Aug. 2021. The above mentioned applications are each incorporated herein by reference in their entireties.

FIELD

The embodiments provided herein generally relate to charged-particle tools that use multiple sub-beams of charged particles.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

There is a general need to improve the throughput and other characteristics of charged-particle tools.

SUMMARY

It is an object of the present disclosure to provide embodiments that support improvement of throughput or other characteristics of charged-particle tools.

According to some embodiments of the present disclosure, there is provided an electron-optical apparatus comprising an electron-optical system comprising: a source configured to provide a beam of charged particles from which a multi-beam is derived; and an objective lens array assembly for an electron-optical system of a charged-particle tool, the objective lens array assembly being configured to focus a multi-beam of sub-beams on a sample and comprising: planar elements defining a plurality of apertures aligned along sub-beam paths of the multi-beam and comprising an objective lens array configured to project the multi-beam towards a sample, wherein the apertures of one or more of the planar elements are configured to compensate for off-axis aberrations in the multi-beam at least a subset of the apertures have a range of different aperture areas, the range of different aperture areas being selected to compensate for off-axis aberrations in the multi-beam.

According to some embodiments of the present disclosure, there is provided a method of focusing a multi-beam of charged particles towards a sample, comprising: providing an objective lens array assembly comprising planar elements defining a plurality of apertures aligned along sub-beam paths of the multi-beam and comprising an objective lens array configured to project the multi-beam towards a sample; and using the apertures defined in one or more of the planar elements to compensate for off-axis aberrations in the multi-beam at least a subset of the apertures have a range of different aperture areas, the range of different aperture areas being selected to compensate for off-axis aberrations in the multi-beam.

BRIEF DESCRIPTION OF FIGURES

The above and other aspects of the present disclosure will become more apparent from the description of exemplary embodiments, taken in conjunction with the accompanying drawings.

FIG. 10 is a schematic side sectional view of a detector module integrated with a two-electrode objective lens array.

FIG. 11 is a bottom view of a detector module of the type depicted in FIG. 10.

FIG. 12 is a bottom view of an alternative detector module where beam apertures are in a hexagonal close packed array.

FIG. 13 depicts is an enlarged schematic cross-sectional view of a detector module for incorporation in the objective lens array of FIG. 10.

DETAILED DESCRIPTION

Figure 1:
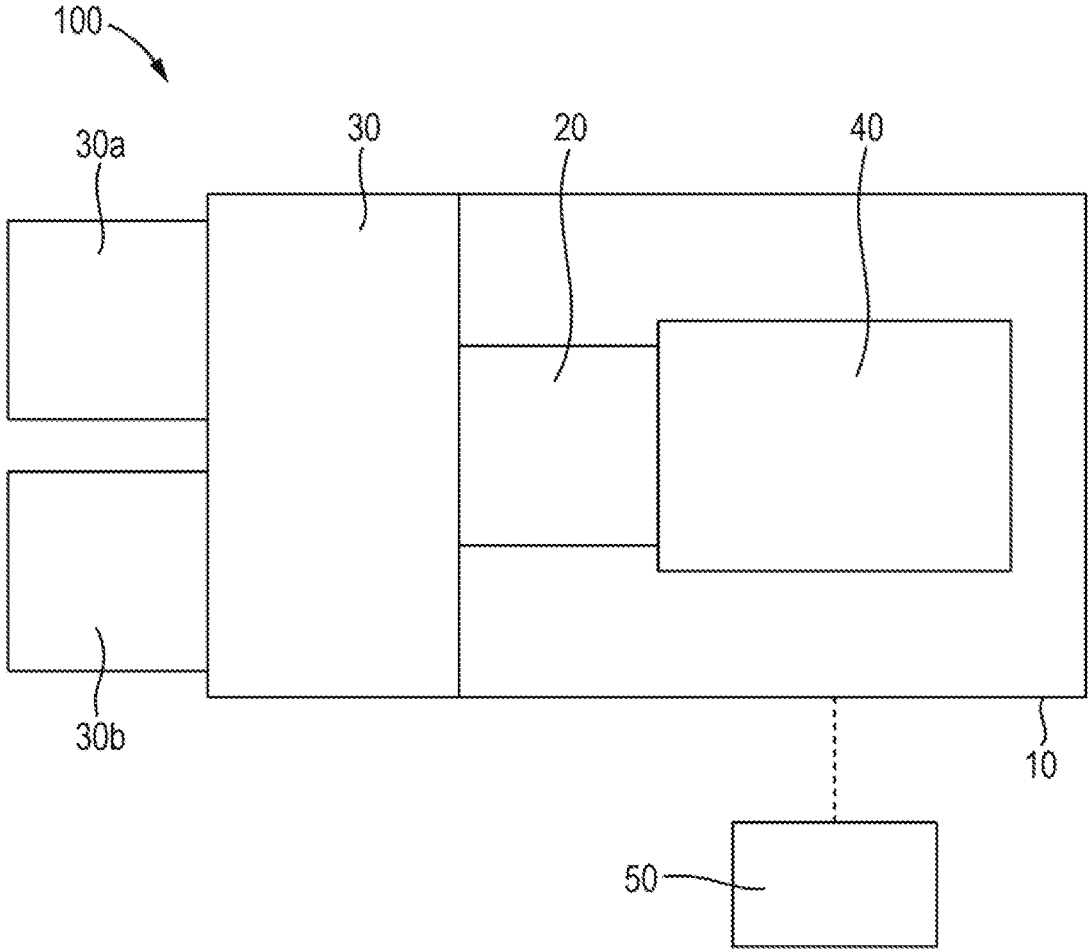
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
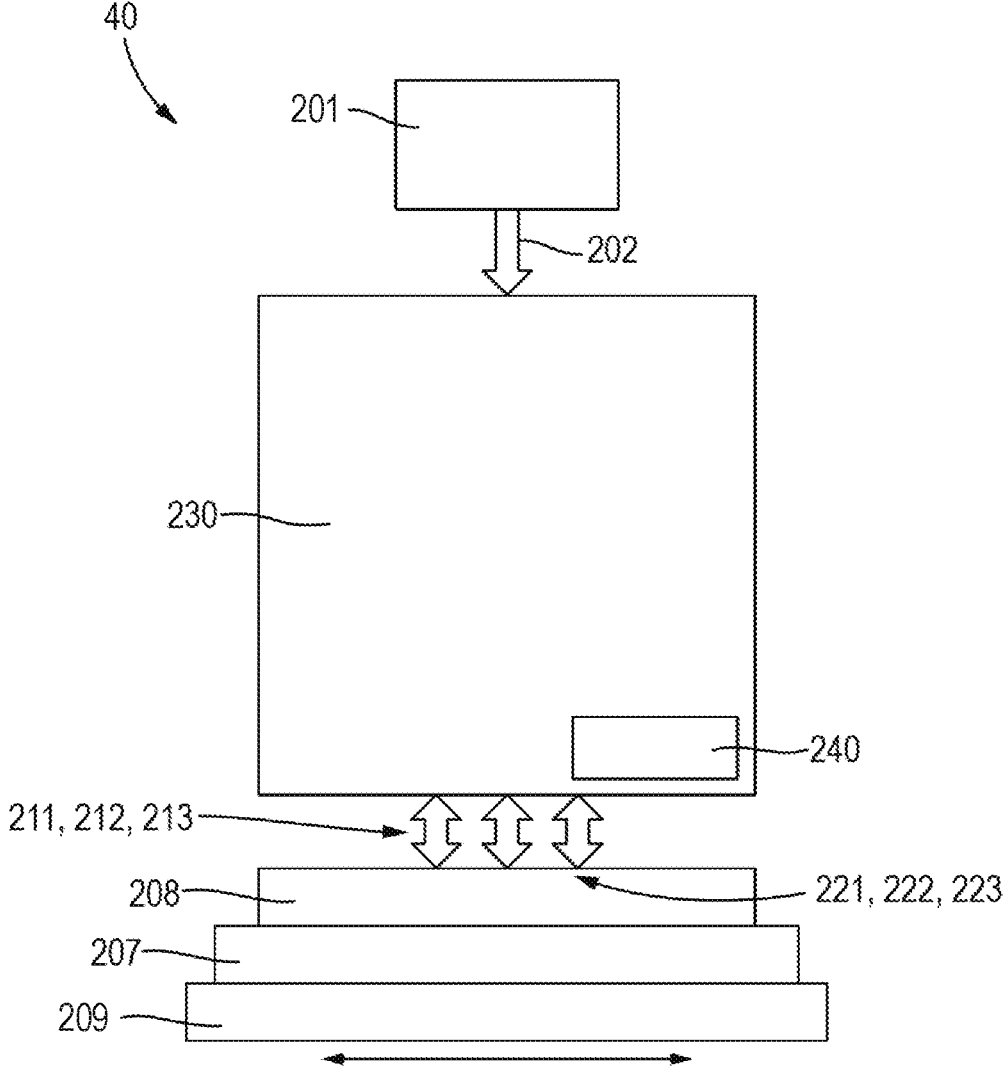
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. Thus the electron beam apparatus may comprise an electron-optical system and a sample holder 207. The sample holder 207 is configured to support a sample. The electron source 201 and projection apparatus 230 may together be referred to as an illumination apparatus. The sample holder 207 may be actuated by the stage 209 which may be part of the electron beam apparatus 40. The sample holder 207 is supported by motorized stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beam-lets.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons and to generate corresponding signals which are sent to controller 50 or a signal processing system (not shown), e.g. to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Embodiments of the present disclosure provide an objective lens array assembly. The objective lens array assembly may be configured to focus a multi-beam of sub-beams on a sample. The objective lens array assembly may be incorporated into an electron-optical system of a charged-particle tool such as a charged particle assessment tool.

Figure 3:
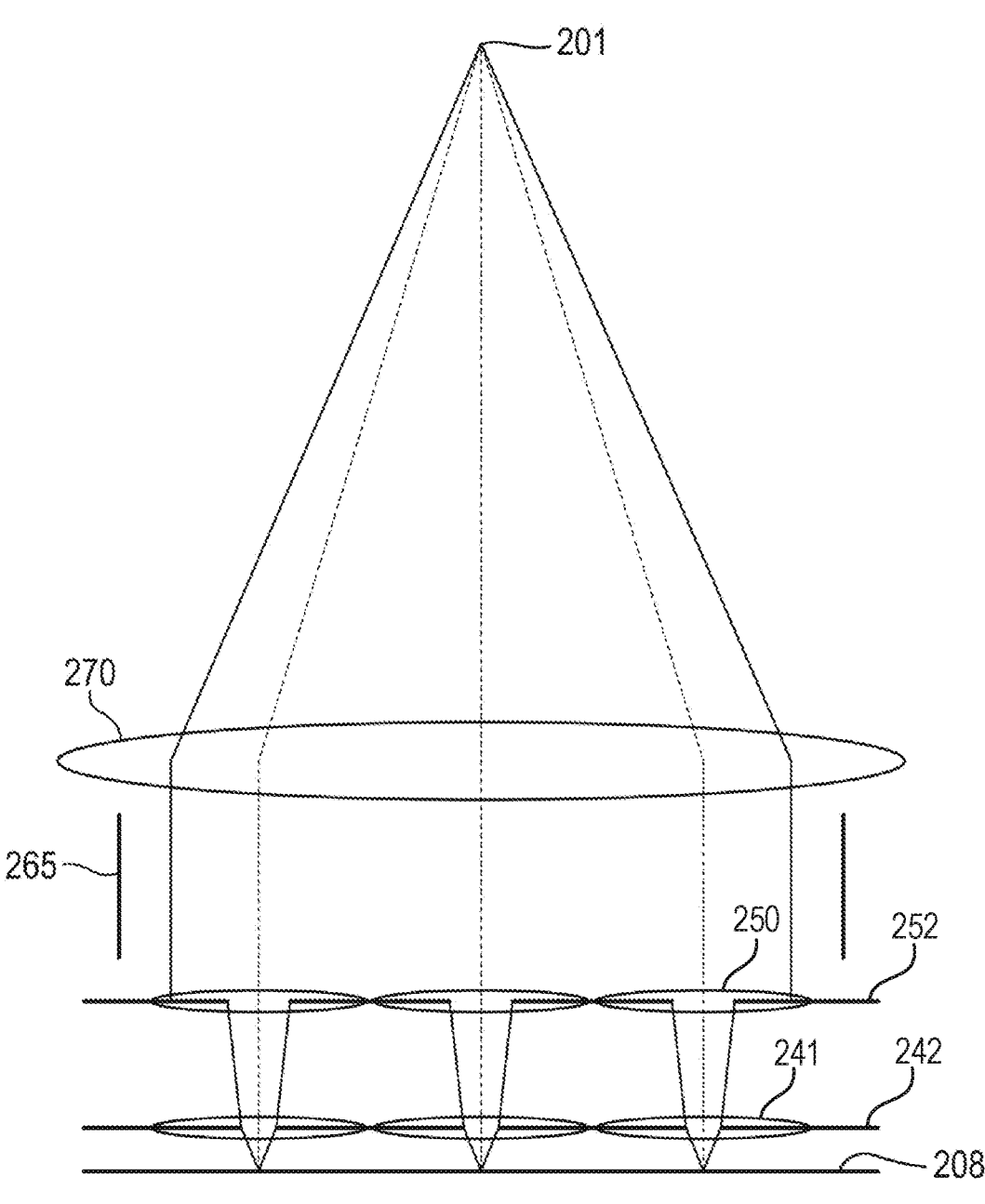
FIG. 3 is a schematic diagram of an exemplary electron-optical system comprising a macro collimator and macro scan deflector.

FIG. 3 is a schematic diagram of an exemplary electron-optical system having the objective lens array assembly. The electron-optical system may feature in the electron-optical apparats shown and described with reference to FIG. 2. Thus the same features present in the apparatus of FIG. 2, such as the source 201, sample holder 207 and stage 208 may be present unless stated to the contrary. The objective lens array assembly comprises planar elements defining a plurality of apertures aligned along sub-beam paths of the multi-beam. The objective lens array assembly comprises an objective lens array 241. The planar elements of the objective lens array assembly comprise the objective lens array 241. The objective lens array 241 may comprise a plurality of the planar elements. The planar elements of the objective lens array 241 may be configured to act as electrodes. The planar elements may, for example, be metallic and/or configured to be connected to respective potential sources. The planar elements of the objective lens array 241 may be referred to as electrodes or plate electrode arrays. A plurality of apertures that are aligned along each sub-beam path may be defined in different respective planar elements (electrodes) of the objective lens array 241. The positions of apertures defined in one of the planar elements of the objective lens array 241 thus correspond to the positions of corresponding apertures in one or more other planar elements of the objective lens array 241. Each group of apertures aligned along a sub-beam path define one of the objective lenses and operates in use on the same sub-beam in the multi-beam. Each objective lens projects a respective sub-beam of the multi-beam onto a sample 208. The objective lens array 241 comprises a plurality of the objective lenses.

For ease of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. As described above, lens arrays may instead comprise multiple planar elements defining apertures.

In some embodiments, the planar elements of the objective lens array assembly further comprise a control lens array 250. The control lens array 250 comprises a plurality of control lenses. Each control lens comprises at least two planar elements configured to act as electrodes (e.g. two or three planar elements configured to act as electrodes). The planar elements of the control lens array 250 may be connected to respective potential sources. The planar elements of the control lens array 250 may be referred to as electrodes. The control lens array 250 may comprise two or more (e.g. three) plate electrode arrays connected to respective potential sources. Each plate electrode array is mechanically connected to, and electrically separated from, an adjacent plate electrode array by an isolating element, such as a spacer which may comprise ceramic or glass. The control lens array 250 is associated with the objective lens array 241 (e.g. the two arrays are positioned close to each other and/or mechanically connected to each other and/or controlled together as a unit). The control lens array 250 is positioned up-beam of the objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. In some embodiments, an electron-optical system comprising the objective lens array assembly is configured to control the objective lens array assembly (e.g. by controlling potentials applied to electrodes of the control lens array 250) so that a focal length of the control lenses is larger than a separation between the control lens array 250 and the objective lens array 241. The control lens array 250 and objective lens array 241 may thus be positioned relatively close together, with a focusing action from the control lens array 250 that is too weak to form an intermediate focus between the control lens array 250 and objective lens array 241. The control lens array and the objective lens array operate together to form a combined focal length to the same surface. Combined operation without an intermediate focus may reduce the risk of aberrations. In other embodiments, the objective lens array assembly may be configured to form an intermediate focus between the control lens array 250 and the objective lens array 241.

An electric power source may be provided to apply respective potentials to electrodes of the control lenses of the control lens array 250 and the objective lenses of the objective lens array 241.

The provision of a control lens array 250 in addition to an objective lens array 241 provides additional degrees of freedom for controlling properties of the sub-beams. The additional freedom is provided even when the control lens array 250 and objective lens array 241 are provided relatively close together, for example such that no intermediate focus is formed between the control lens array 250 and the objective lens array 241. In view of the additional electrodes of the control lens array 250 providing further degrees of freedom for controlling the electron-optical parameters of the sub-beams (for example addition of an additional electrode of the control lens array 250 may provide an extra degree of freedom), the control lens array 250 may be considered as providing electrodes additional to the electrodes 242, 243 of the objective lens array 241 for example as part of the objective lens array assembly (or objective lens arrangement). In some embodiments, the control lens array 250 may be considered to be additional electrodes of the objective lens array 241 enabling additional functionality of the respective objective lenses of the objective lens array 241. In an arrangement such electrodes may be considered part of the objective lens array providing additional functionality to the objective lenses of the objective lens array 241. In such an arrangement, the control lens is considered to be part of the corresponding objective lens, even to the extent that the control lens is only referred to as being a part of the objective lens In an arrangement, the control lens array 250 may be used to optimize a beam opening angle with respect to the demagnification of the beam and/or to control the beam energy delivered to the objective lens array 241. The control lens array 250 may comprise 2 or 3 or more electrodes. If there are two electrodes, then the demagnification and landing energy are controlled together. If there are three or more electrodes the demagnification and landing energy can be controlled independently. The control lenses may thus be configured to adjust the demagnification and/or beam opening angle and/or the landing energy on the sample of respective sub-beams (e.g. using the electric power source to apply suitable respective potentials to the electrodes of the control lenses and the objective lenses). This optimization can be achieved without having an excessively negative impact on the number of objective lenses and without excessively deteriorating aberrations of the objective lenses (e.g. without decreasing the strength of the objective lenses). Use of the control lens array enables the objective lens array to operate at its optimal electric field strength. Note that it is intended that the reference to demagnification and opening angle is intended to refer to variation of the same parameter. In an ideal arrangement the product of a range of demagnification and the corresponding opening angles is constant. However, the opening angle may be influenced by the use of an aperture.

Figure 4:
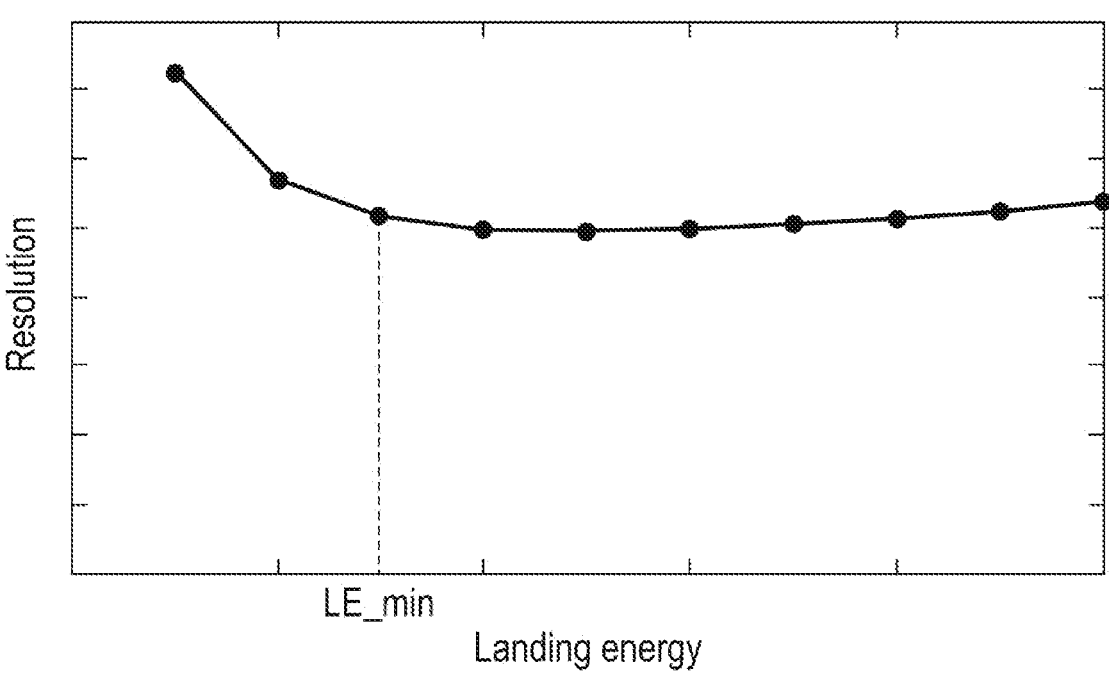
FIG. 4 is a graph of landing energy vs. resolution for an exemplary arrangement.

In some embodiments, the landing energy can be controlled to a desired value in a predetermined range, e.g. from 1000 eV to 5000 eV. FIG. 4 is a graph depicting resolution as a function of landing energy, assuming the beam opening angle/demagnification is re-optimized for changing landing energy. As can be seen, the resolution of the tool can be kept substantially constant with change in landing energy down to a minimum value LE_min. Resolution deteriorates below LE_min because it is necessary to reduce the lens strength of, and electric fields within, the objective lenses in order to maintain a minimum spacing between objective lenses and/or detector and the sample.

Desirably, the landing energy is primarily varied by controlling the energy of the electrons exiting the control lenses. The potential differences within the objective lenses are preferably kept constant during this variation so that the electric field within the objective lenses remains as high as possible. The potentials applied to the control lenses in addition may be used to optimize the beam opening angle and demagnification. The control lenses can function to change the demagnification in view of changes in landing energy. Desirably, each control lens comprises three electrodes so as to provide two independent control variables. For example, one of the electrodes can be used to control magnification while a different electrode can be used to independently control landing energy. Alternatively each control lens may have only two electrodes. When there are only two electrodes, one of the electrodes may need to control both magnification and landing energy.

In the example of FIG. 3, the electron-optical system comprises a source 201. The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam (e.g. as described below with reference to FIG. 6). The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In the example of FIG. 3 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 256 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of elements that are each configured to act on a different individual portion of the beam. In the example shown, the macro scan deflector 265 is provided between the macro collimator 270 and the control lens array 250.

Any of the objective lens array assemblies described herein may further comprise a detector (e.g. comprising a detector module 402). The detector detects charged particles emitted from the sample 208. The detected charged particles may include any of the charged particles detected by an SEM, including secondary and/or backscattered electrons emitted from the sample 208. At least portion of the detector may be adjacent to and/or integrated with the objective lens array 241. The detector may provide a sample facing surface of the objective lens array assembly. An exemplary construction of a detector is described below with reference to FIGS. 10-15. The detector and objective lens may be part of the same structure. The detector may be connected to the lens by an isolating element or directly to an electrode of the objective lens.

Figure 5:
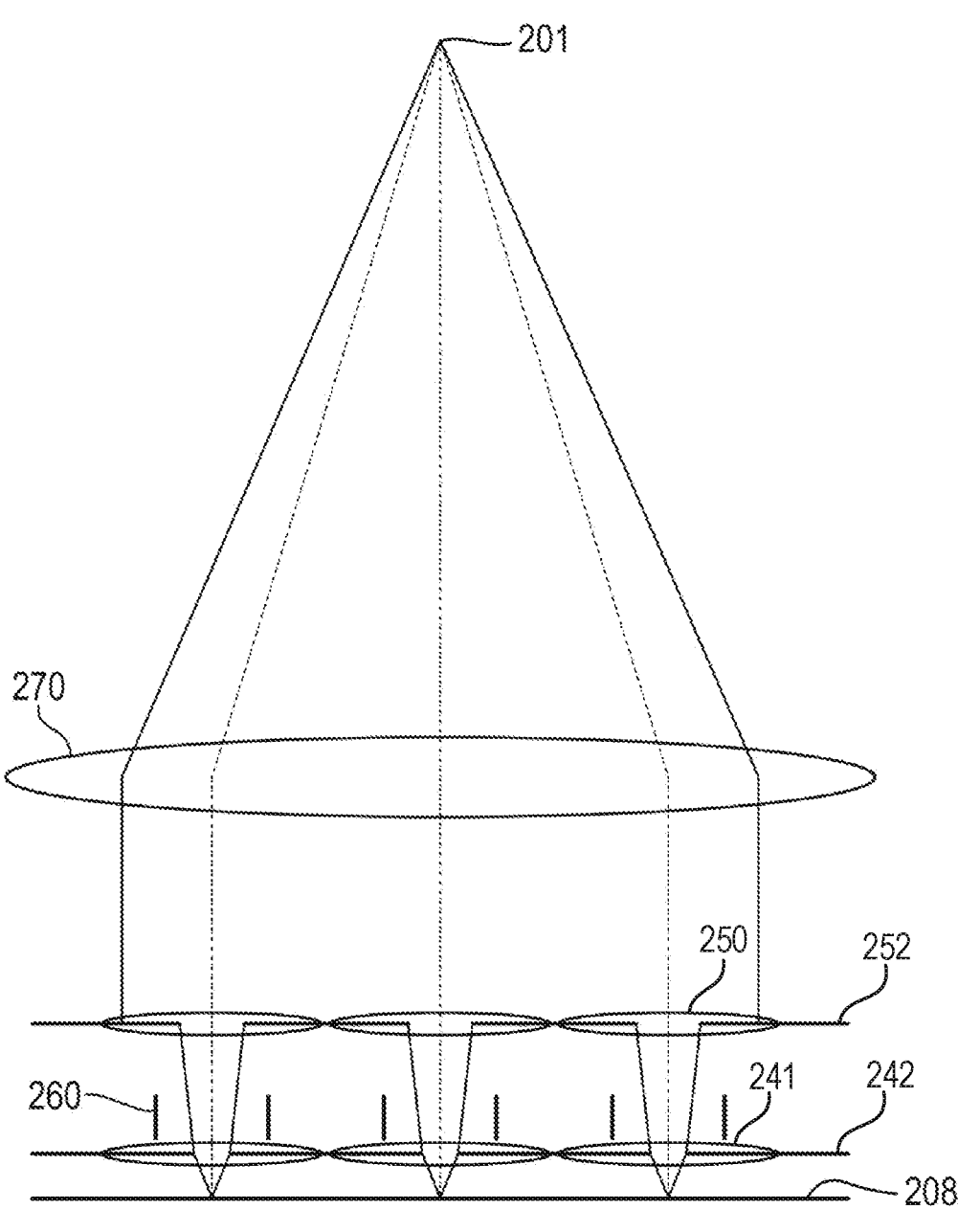
FIG. 5 is a schematic diagram of an exemplary electron-optical system comprising a macro collimator and scan-deflector array.

FIG. 5 depicts a variation on the example of FIG. 3. The electron-optical system may include the same features as shown and described with reference to FIG. 5 unless stated to the contrary. Thus the electron-optical system 40 may feature in an electron-optical apparatus of the type shown and described with reference to FIG. 2. Thus the same features present in the apparatus of FIG. 2, such as the source 201, sample holder 207 and stage 208 may be present unless stated to the otherwise. in which the objective lens array assembly comprises a scan-deflector array 260. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). In some embodiments, the scanning deflectors described in EP2425444, which document is hereby incorporated by reference in its entirety specifically in relation to scan deflectors, may be used to implement the scan-deflector array 260. The scan-deflector array 260 is positioned between the objective lens array 241 and the control lens array 250. In the example shown, the scan-deflector array 260 is provided instead of the macro scan deflector 265. A scan-deflector array 260 (e.g. formed using MEMS manufacturing techniques as mentioned above) may be more spatially compact than a macro scan deflector 265.

In other embodiments both the macro scan deflector 265 and the scan-deflector array 260 are provided. In such an arrangement, the scanning of the sub-beams over the sample surface may be achieved by controlling the macro scan deflector 265 and the scan-deflector array 260 together, preferably in synchronization.

The provision of a scan-deflector array 260 instead of a macro scan deflector 265 can reduce aberrations from the control lenses. This may arise because the scanning action of the macro scan deflector 265 causes a corresponding movement of beams over a beam shaping limiter (which may also be referred to as a lower beam limiter) defining an array of beam-limiting apertures down-beam of at least one electrode of the control lenses, which increases a contribution to aberration from the control lenses. When a scan-deflector array 260 is used instead the beams are moved by a much smaller amount over the beam shaping limiter. This is because the distance from the scan-deflector array 260 to the beam shaping limiter is much shorter. Because of this it is preferable to position the scan-deflector array 260 as close as possible to the objective lens array 241 (e.g. such that the scan-deflector array 260 is directly adjacent to the objective lens array 241 and/or closer to the objective lens array 241 than to the control lens array 250), as depicted in FIG. 5. The smaller movement over the beam shaping limiter results in a smaller part of each control lens being used. The control lenses thus have a smaller aberration contribution. To minimize, or at least reduce, the aberrations contributed by the control lenses the beam shaping limiter is used to shape beams down beam from at least one electrode of the control lenses. This differs architecturally from conventional systems in which a beam shaping limiter is provided only as an aperture array that is part of or associated with a first manipulator array in the beam path and commonly generates the multi-beams from a single beam from a source.

In some embodiments, as exemplified in FIGS. 3 and 5, the control lens array 250 is the first deflecting or lensing electron-optical array element in the beam path down-beam of the source 201.

Figure 6:
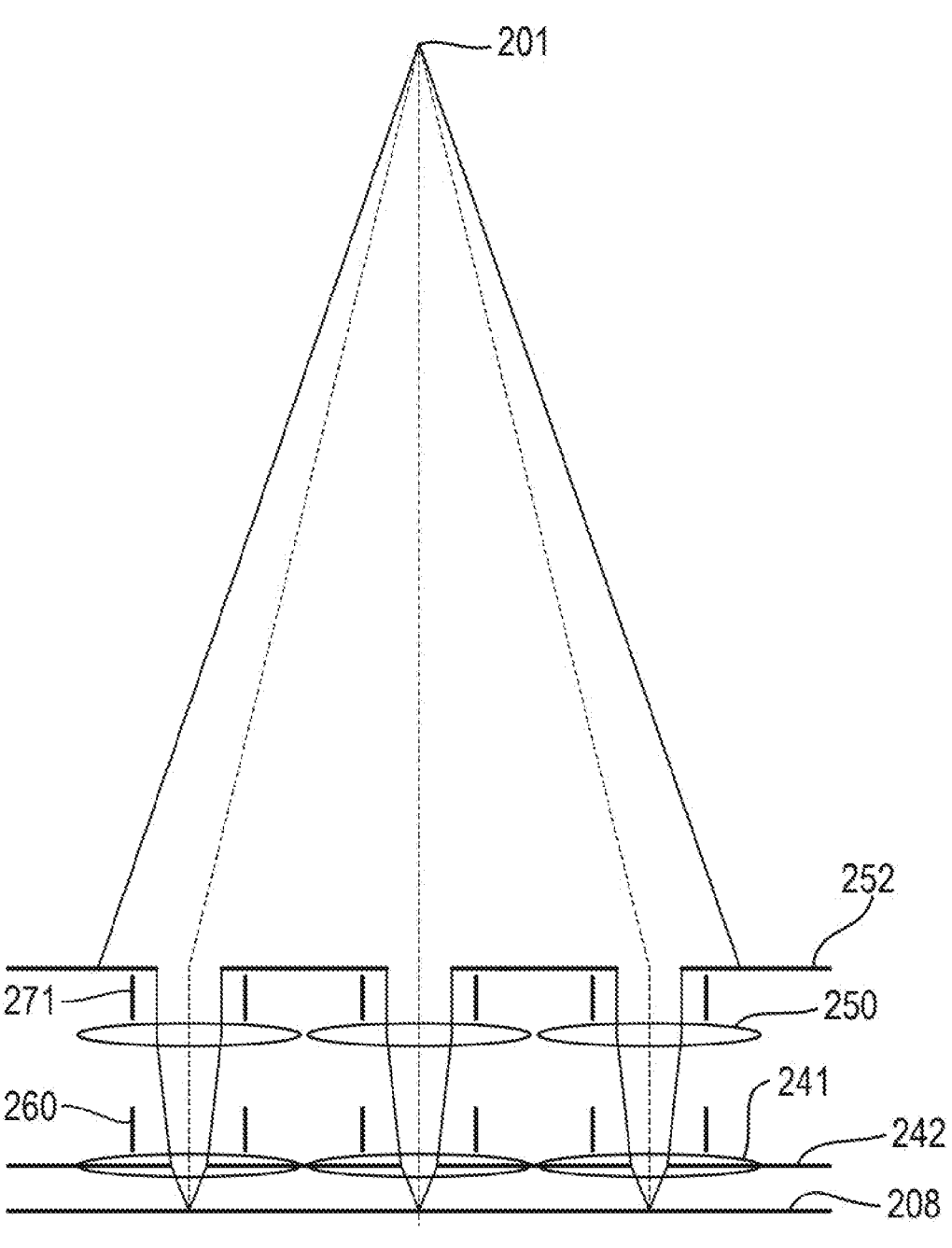
FIG. 6 is a schematic diagram of an exemplary electron-optical system comprising a collimator element array and a scan-deflector array.

FIG. 6 depicts a variation on the embodiments of the electron-optical system shown in and described with reference to FIG. 5 (which may feature in the electron-optical apparatus shown in and described with reference to FIG. 2) in which a collimator element array 271 is provided instead of a macro collimator 270. Although not shown, it is also possible to apply this variation to the example of FIG. 3, to provide an example having a macro scan deflector and a collimator element array. Each collimator element collimates a respective sub-beam. The collimator element array 271 (e.g. formed using MEMS manufacturing techniques) may be more spatially compact than a macro collimator 270. Providing the collimator element array 271 and the scan-deflector array 260 together may therefore provide space saving. This space saving is desirable where a plurality of the electron-optical systems comprising the objective lens array assembly are provided in an electron-optical system array 500, as discussed below with reference to FIG. 7. In such an example there may be no macro condenser lens or a condenser lens array. In this scenario, the control lens provides the possibility to optimize the beam opening angle and magnification for changes in landing energy. Note that the beam shaping limiter is downbeam of the control lens array. The apertures in the beam shaping limiter adjust the beam current along the beam path so that control of the magnification by the control lens operates differently on the opening angle. That is the apertures in the beam shaping limiter break the direct correspondence between variations in the magnification and opening angle.

In some embodiments, as exemplified in FIG. 6, the collimator element array 271 is the first deflecting or focusing electron-optical array element in the beam path down-beam of the source 201.

Avoiding any deflecting or lensing electron-optical array elements (e.g. lens arrays or deflector arrays) up-beam of the control lens array 250 (e.g. in FIGS. 3 and 5) or up-beam of the collimator element array 271 (e.g. in FIG. 6) reduces requirements for electron-optics up-beam of the objective lenses, and for correctors to correct for imperfections in such electron-optics, i.e. aberrations generated in the sub-beams by such optics. For example, some alternative arrangements seek to maximize source current utilization by providing a condenser lens array in addition to an objective lens array (as discussed below with reference to FIG. 8). The provision of a condenser lens array and an objective lens array in this manner results in stringent requirements on position of the virtual source position uniformity over the source opening angle, or requires corrective optics per sub-beam in order to make sure each sub-beam passes through the center of its corresponding objective lens down-beam. Architectures such as those of FIGS. 3, 5 and 6 allow the beam path from the first deflecting or lensing electron-optical array element to a down-beam beam shaping limiter to be reduced to less than about 10 mm, preferably to less than about 5 mm, preferably to less than about 2 mm Reducing the beam path reduces or removes the stringent requirements on virtual source position over the source opening angle. The electron-optical column 40 of such architectures as depicted and described with reference to FIGS. 3, 5 and 6 may comprise components such as an upper beam limiter 252, a collimator element array 271, a control lens array 250, a scan deflector array 260, an objective lens array 241, a beam shaping limiter 242 and a detector array 240; one or more of these elements that are present may be connected to one more adjacent elements with an isolating element such as a ceramic or glass spacer.

Figure 7:
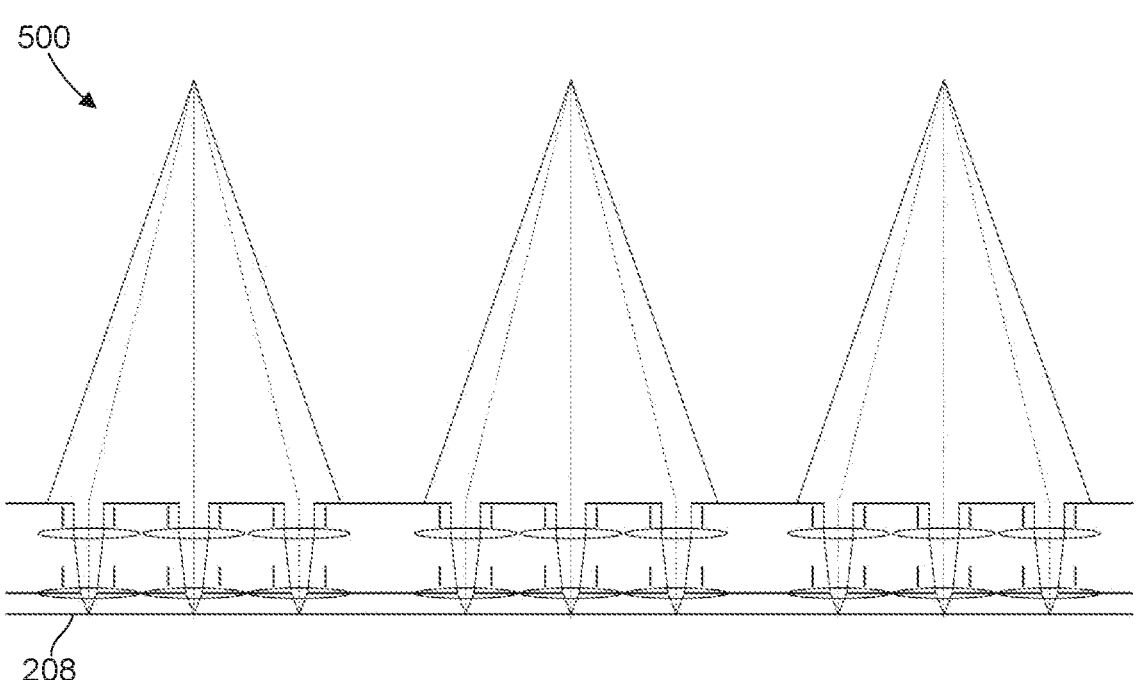
FIG. 7 is a schematic diagram of an exemplary electron-optical system array comprising the electron optical systems of FIG. 6.

In some embodiments, as exemplified in FIG. 7, an electron-optical system array 500 is provided. The array 500 may comprise a plurality of any of the electron-optical systems described herein. The array 500 may be comprise the electron-optical system in an electron-optical apparatus. Each of the electron-optical systems focuses respective multi-beams simultaneously onto different regions of the same sample. Each electron-optical system may form sub-beams from a beam of charged particles from a different respective source 201. Each respective source 201 may be one source in a plurality of sources 201. At least a subset of the plurality of sources 201 may be provided as a source array. The source array may comprise a plurality of sources 201 provided on a common substrate. The focusing of plural multi-beams simultaneously onto different regions of the same sample allows an increased area of the sample 208 to be processed (e.g. assessed) simultaneously. The electron-optical systems in the array 500 may be arranged adjacent to each other so as to project the respective multi-beams onto adjacent regions of the sample 208. Any number of electron-optical systems may be used in the array 500. Preferably, the number of electron-optical systems is in the range of from 9 to 200. In some embodiments, the electron-optical systems are arranged in a rectangular array or in a hexagonal array. In other embodiments, the electron-optical systems are provided in an irregular array or in a regular array having a geometry other than rectangular or hexagonal. Each electron-optical system in the array 500 may be configured in any of the ways described herein when referring to a single electron-optical system, for example as described above, especially with respect to the example shown and described in reference to FIG. 6. Details of such an arrangement is described in EPA 20184161.6 filed 6 Jul. 2020 which, with respect to how the objective lens is incorporated and adapted for use in the multi-column arrangement is hereby incorporated by reference. In the example of FIG. 7 the array 500 comprises a plurality of electron-optical systems of the type described above with reference to FIG. 6. Each of the electron-optical systems in this example thus comprise both a scan-deflector array 260 and a collimator element array 271. As mentioned above, the scan-deflector array 260 and collimator element array 271 are particularly well suited to incorporation into an electron-optical system array 500 because of their spatial compactness, which facilitates positioning of the electron-optical systems close to each other.

The arrangement shown in FIG. 6 may be preferred over the arrangements shown in FIGS. 3 and 5 because unlike in the arrangement shown in FIG. 6 preferred implementations may use a magnetic lens as collimator 270. Magnetic lenses may be challenging to incorporate into an electron-optical system intended for use in an array (a multi-column arrangement).

Figure 8:
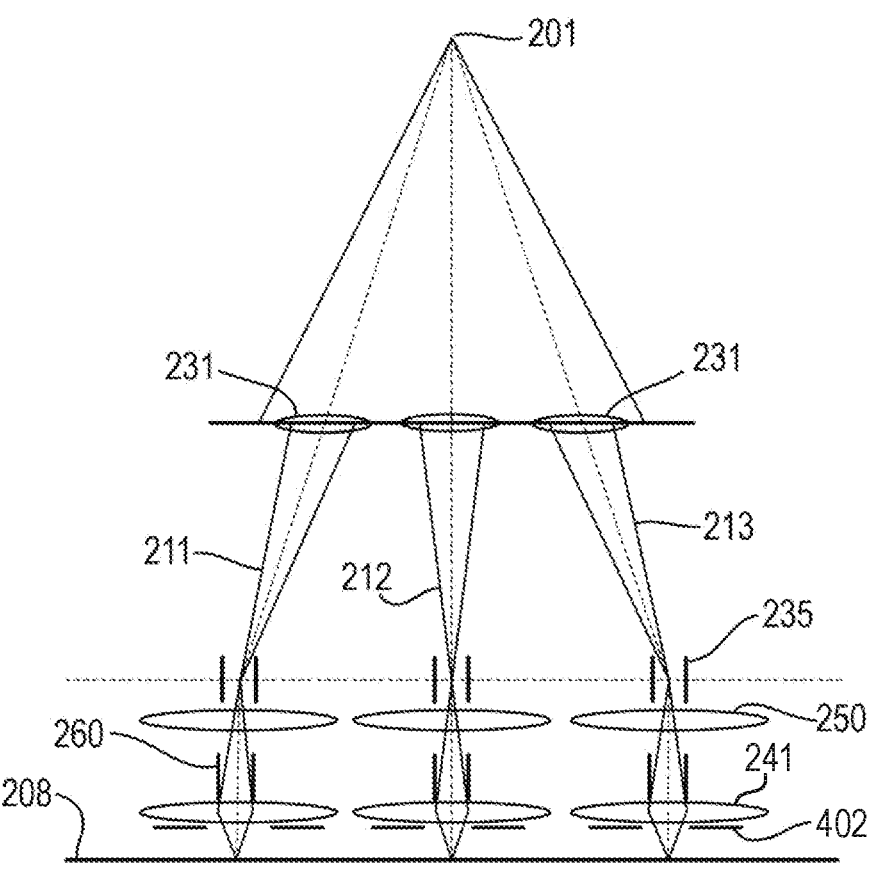
FIG. 8 is a schematic diagram of an exemplary electron-optical system comprising a condenser lens array up-beam of an objective lens array assembly.

FIG. 8 depicts a variation on the embodiments of electron-optical system of FIGS. 3, 5 and 6 in which a condenser lens array 231 is provided between the source 201 and the objective lens array assembly. The electron-optical system shown in and described with reference to FIG. 8 which may feature as the electron-optical system 40 of the electron-optical apparatus shown in and described with reference to FIG. 2. The condenser lens array is thus upbeam of the objective lens array assembly. Such an arrangement is described in EPA 20158804.3 hereby incorporated by reference at least with respect to the architecture shown in FIG. 4. The arrangement may also be incorporated in a multi-column array, for example EPA 20206987.8 filed 11 Nov. 2020, such as that discussed above with reference to FIG. 7. The condenser lens array 231 comprises a plurality of condenser lenses. There may be many tens, many hundreds or many thousands of condenser lenses. The condenser lenses may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array 231 may be configured to generate the multi-beam. The condenser lens array may take the form of at least two planar elements (which may be referred to as plates), acting as electrodes, with an aperture in each plate aligned with each other and corresponding to the location of a sub-beam. At least two of the planar elements are maintained during operation at different potentials to achieve the desired lensing effect. The planar elements of the condenser lens array 231 may be referred to as plate arrays.

In an arrangement the condenser lens array is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

The condenser lens array 231 may have two or more plate electrodes each with an array of apertures that are aligned. Each plate electrode array is mechanically connected to, and electrically isolated from, an adjacent plate electrode array by an isolating element, such as a spacer which may comprise ceramic or glass. The condenser lens array may be connected and/or spaced apart from an adjacent electron-optical element, preferably an electrostatic electron-optical element, by an isolating element such as a spacer as described elsewhere herein.

The condenser lenses are separated from a module containing the objective lenses (such as an objective lens array assembly as discussed elsewhere herein). In a case where the potential applied on a bottom surface of the condenser lenses is different than the potential applied on the top surface of the module containing the objective lenses an isolating spacer is used to space apart the condenser lenses and the module containing the objective lenses. In a case where the potential is substantially equal, a conductive element can be used to space apart the condenser lenses and the module containing the objective lenses. In an arrangement, a scan deflector array 260 may be interposed between the condenser lenses and the objective lenses Each condenser lens in the array directs electrons into a respective sub-beam 211, 212, 213 which is focused at a respective intermediate focus. Each condenser lens forms a respective intermediate focus between the condenser lens array 231 and a respective objective lens in the objective lens array assembly. The condenser lens array 231 is preferably configured such that the sub-beam paths diverge with respect to each other between the condenser lens array 231 and a plane of intermediate focuses. In the example shown, deflectors 235 are provided at the intermediate focuses (i.e. in the plane of intermediate focuses). Deflectors 235 are configured to bend a respective beamlet 211, 212, 213 by an amount effective to ensure that the principal ray (which may also be referred to as the beam axis) is incident on the sample 208 substantially normally (i.e. at substantially 90° to the nominal surface of the sample). Deflectors 235 may also be referred to as collimators. The deflectors 235 in effect collimate the paths of the beamlets so that before the deflectors, the beamlets paths with respect to each other are diverging. Down beam of the deflectors the beamlet paths are substantially parallel with respect to each other, i.e. substantially collimated. Suitable collimators are deflectors disclosed in EP Application 20156253.5 filed on 7 Feb. 2020 which is hereby incorporated by reference with respect to the application of the deflectors to a multi-beam array.

Figure 9:
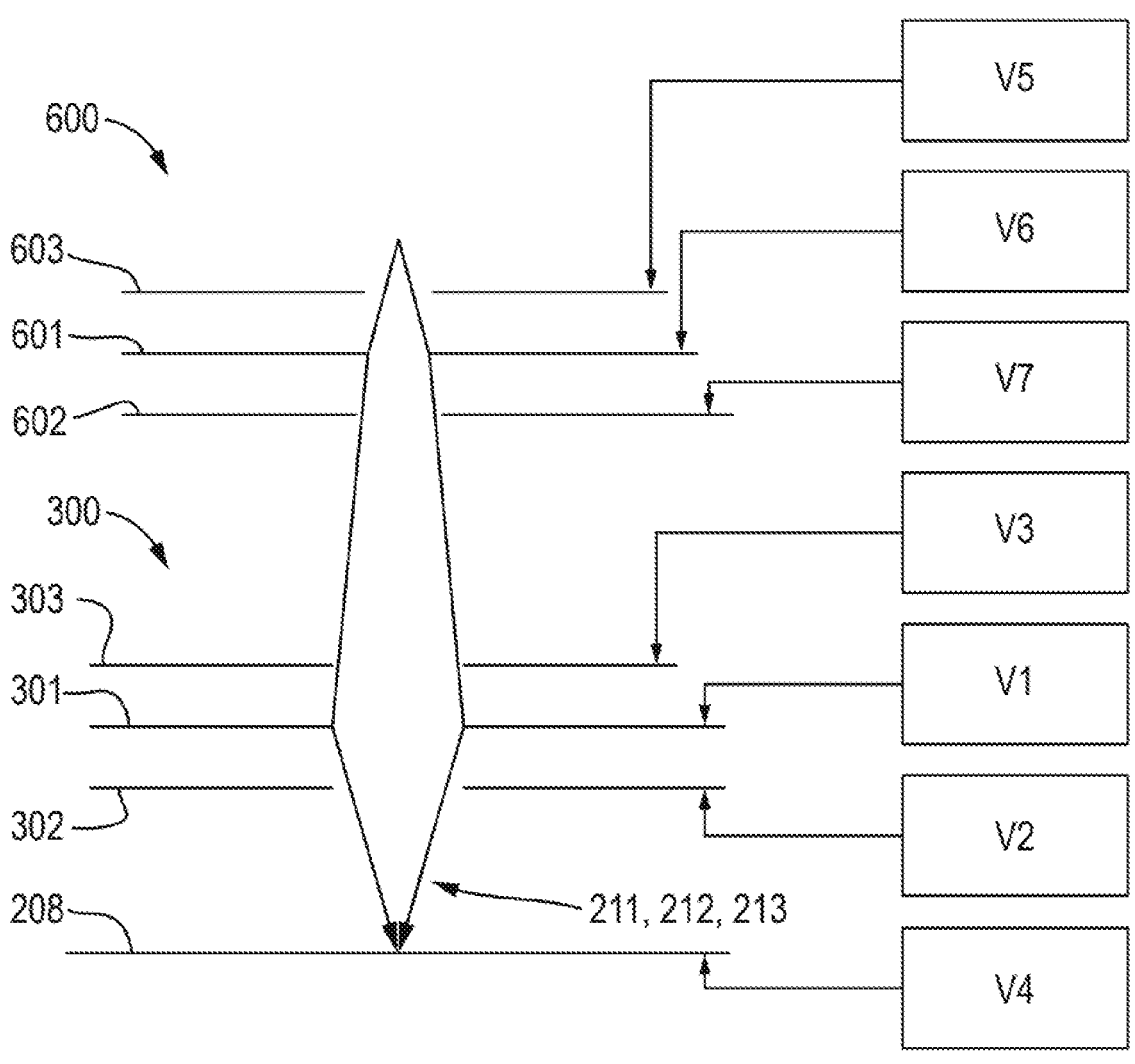
FIG. 9 is an enlarged diagram of a control lens and an objective lens.

FIG. 9 is an enlarged schematic view of one objective lens 300 of the objective lens array 241 and one control lens 600 of the control lens array 250. Objective lens 300 can be configured to de-magnify the electron beam by a factor greater than 10, desirably in the range of 50 to 100 or more. The objective lens 300 comprises a middle or first electrode 301, a lower or second electrode 302 and an upper or third electrode 303. Voltage sources V1, V2, V3 are configured to apply potentials to the first second and third electrodes respectively. A further voltage source V4 is connected to the sample to apply a fourth potential, which may be ground. Potentials can be defined relative to the sample 208. The first, second and third electrodes are each provided with an aperture through which the respective sub-beam propagates. The second potential can be similar to the potential of the sample, e.g. in the range of from 50 V to 200 V more positive than the sample. Alternatively the second potential can be in the range of from about +500 V to about +1,500 V more positive than the sample. A higher potential is useful if a detector is higher in the optical column than the lowest electrode. The first and/or second potentials can be varied per aperture or group of apertures to effect focus corrections.

Desirably, in some embodiments, the third electrode is omitted. An objective lens having only two electrodes can have lower aberration than an objective lens having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam.

As mentioned above, it is desirable to use the control lens to determine the landing energy. However, it is possible to use in addition the objective lens 300 to control the landing energy. In such a case, the potential difference over the objective lens is changed when a different landing energy is selected. One example of a situation where it is desirable to partly change the landing energy by changing the potential difference over the objective lens is to prevent the focus of the sub-beams getting too close to the objective lens. In such a situation there is a risk of the objective lens electrode having to be too thin to be manufacturable. The same may be said about a detector at this location. This situation can for example occur in case the landing energy is lowered. This is because the focal length of the objective lens roughly scales with the landing energy used. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further, using the objective lens to control the landing energy could mean that the objective lens would be operating away from its optimal field strength. That is unless mechanical parameters of the objective lens (such as the spacing between its electrodes) could be adjusted, for example by exchanging the objective lens.

In the arrangement depicted, the control lens 600 comprises three electrodes 601-603 connected to potential sources V5 to V7. Electrodes 601-603 may be spaced a few millimeters (e.g. 3 mm) apart. The spacing between the control lens and the objective lens (i.e. the gap between lower electrode 602 and the upper electrode of the objective lens) can be selected from a wide range, e.g. from 2 mm to 200 mm or more. A small separation makes alignment easier whereas a larger separation allows a weaker lens to be used, reducing aberrations. Desirably, the potential V5 of the uppermost electrode 603 of the control lens 600 is maintained the same as the potential of the next electron-optic element up-beam of the control lens (e.g. deflectors 235). The potential V7 applied to the lower electrode 602 can be varied to determine the beam energy. The potential V6 applied to the middle electrode 601 can be varied to determine the lens strength of the control lens 600 and hence control the opening angle and demagnification of the beam. Desirably, the lower electrode 602 of the control lens and the uppermost electrode of the objective lens have substantially the same potential. The sample and the lowest electrode of the objective lens typically have a very different potential than the lowest electrode of the control lens. The electrons may for example be decelerated from 30 kV to 2.5 kV in the objective lens. In one design the upper electrode of the objective lens V3 is omitted. In this case desirably the lower electrode 602 of the control lens and electrode 301 of the objective lens have substantially the same potential. It should be noted that even if the landing energy does not need to be changed, or is changed by other means, the control lens can be used to control the beam opening angle. The position of the focus of a sub-beam is determined by the combination of the actions of the respective control lens and the respective objective lens.

In an example, to obtain landing energies in the range of 1.5 kV to 2.5 kV, potentials V5, V6 and V7 can be set as indicated in Table 1 below. The potentials in this table are given as values of beam energy in keV, which is equivalent to the electrode potential relative to the cathode of the beam source 201. It will be understood that in designing an electron-optical system there is considerable design freedom as to which point in the system is set to a ground potential and the operation of the system is determined by potential differences rather than absolute potentials.

17

TABLE 1

| Landing Energy | 1.5 keV | 2.5 keV | 3.5 keV |
|---|---|---|---|
| V1 | 29 keV | 30 keV | 31 keV |
| V2 | 1.55 keV | 2.55 keV | 3.55 keV |
| V3 (or omitted) | 29 keV | 30 keV | 31 keV |
| V4 | 1.5 keV | 2.5 keV | 3.5 keV |
| V5 | 30 keV | 30 keV | 30 keV |
| V6 | 19.3 keV | 20.1 keV | 20.9 keV |
| V7 | 29 keV | 30 keV | 31 keV |

It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields.

When the control lens, rather than the condenser lens of for example FIG. 8, is used for opening angle/magnification correction of the electron beam, the collimator remains at the intermediate focus so there is no need for astigmatism correction of the collimator. (It should be noted that in such an arrangement adjustment of magnification results in similar adjustment of the opening angle because the beam current remains consistent along the beam path). In addition, the landing energy can be varied over a wide range of energies whilst maintaining an optimum field strength in the objective lens. This minimizes aberrations of the objective lens. The strength of the condenser lens (if used) is also maintained constant, avoiding any introduction of additional aberrations due to the collimator not being at the intermediate focal plane or to changes in the path of the electron through the condenser lens. Further, when the control lens of an example featuring a beam-shaping limiter such as shown in FIGS. 3, 5 and 6 (which does not have a condenser lens), is used the opening angle/magnification may additionally be controlled as well as the landing energy.

In some embodiments, the charged particle tool further comprises one or more aberration correctors that reduce one or more aberrations in the sub-beams. In some embodiments, each of at least a subset of the aberration correctors is positioned in, or directly adjacent to, a respective one of the intermediate foci (e.g. in or adjacent to the intermediate image plane) in embodiments of the type depicted in FIG. 8. The sub-beams have the smallest cross-sectional area in or near a focal plane such as the intermediate plane (a plane of intermediate focuses). This provides more space for aberration correctors than is available elsewhere, i.e. upbeam or downbeam of the intermediate plane (or than would be available in alternative arrangements that do not have an intermediate plane).

In some embodiments, aberration correctors positioned in, or directly adjacent to, the intermediate foci (or intermediate plane) comprise deflectors to correct for the source 201 appearing to be at different positions for different beams Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses of the condenser lens array 231 (e.g. with each such aberration correctors being integrated with, or directly adjacent to, one or more of the condenser lenses). This is desirable because at or near the condenser lenses aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream (or down-beam). The condenser lenses and correctors may be part of the same structure. For example they may be connected to each other, for example with an electrically isolating element.

In some embodiments, each of at least a subset of the aberration correctors is integrated with, or directly adjacent to, one or more of the objective lenses or control lenses in the objective lens array assembly. In some embodiments, these aberration correctors reduce one or more of the following: field curvature; focus error; and astigmatism. The objective lenses and/or control lenses and correctors may be part of the same structure. For example they may be connected to each other, for example with an electrically isolating element.

The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, the detector of the objective lens array assembly comprises a detector module down-beam of at least one electrode of the objective lens array 241. In some embodiments, at least a portion of the detector (e.g. the detector module) is adjacent to and/or integrated with the objective lens array 241. For example, the detector module may be implemented by integrating a CMOS chip detector into a bottom electrode of the objective lens array 241. Integration of a detector module into the objective lens array assembly replaces a secondary column. The CMOS chip is preferably orientated to face the sample (because of the small distance (e.g. 100 μm) between sample and bottom of the electron-optical system) and thereby provide a sample facing surface of the assembly. In some embodiments, electrodes to capture the secondary electron signals are formed in the top metal layer of the CMOS device. The electrodes can be formed in other layers. Power and control signals of the CMOS may be connected to the CMOS by through-silicon vias. For robustness, preferably the bottom electrode consists of two elements: the CMOS chip and a passive Si plate with holes. The plate shields the CMOS from high E-fields.

In order to maximize the detection efficiency it is desirable to make the electrode surface as large as possible, so that substantially all the area of the objective lens array 241 (excepting the apertures) is occupied by electrodes and each electrode has a diameter substantially equal to the array pitch. In some embodiments the outer shape of the electrode is a circle, but this can be made a square to maximize the detection area. Also the diameter of the through-substrate hole can be minimized Typical size of the electron beam is in the order of 5 to 15 micron.

In some embodiments, a single electrode surrounds each aperture. In another example, a plurality of electrode elements are provided around each aperture. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by the electrode may be amplified by a Trans Impedance Amplifier.

An example of a detector integrated into an objective lens array is shown in FIG. 10. FIG. shows a portion 401 of the objective lens array in schematic cross-section. In this example, the detector comprises a detector module 402 comprising a plurality of detector elements 405 (e.g. sensor elements such as capture electrodes). In this example, the detector module 402 is provided on an output side of the objective lens array. The output side is the side facing the sample 208. FIG. 11 is a bottom view of detector module 402 which comprises a substrate 404 on which are provided a plurality of capture electrodes 405 each surrounding a beam aperture 406. The beam apertures 406 may be formed by etching through substrate 404. In the arrangement shown in FIG. 11, the beam apertures 406 are shown in a rectangular array. The beam apertures 406 can also be differently arranged, e.g. in a hexagonal close packed array as depicted in FIG. 12.

FIG. 13 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. Logic layer 407 and capture electrodes 405 can be manufactured using a CMOS process with the capture electrodes 405 forming the final metallization layer.

A wiring layer 408 is provided on the backside of, or within, substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detector module 402 can also be fabricated using bipolar or other manufacturing techniques. A printed circuit board and/or other semiconductor chips may be provided on the backside of detector module 402.

A detector module 402 can also be integrated into other electrode arrays, not only the lowest electrode array of the objective lens array. Further details and alternative arrangements of a detector module integrated into an objective lens can be found in EP Application No. 20184160.8, which document is hereby incorporated by reference at least with respect to the detector module and integration of such a module in an objective lens.

Figure 14:
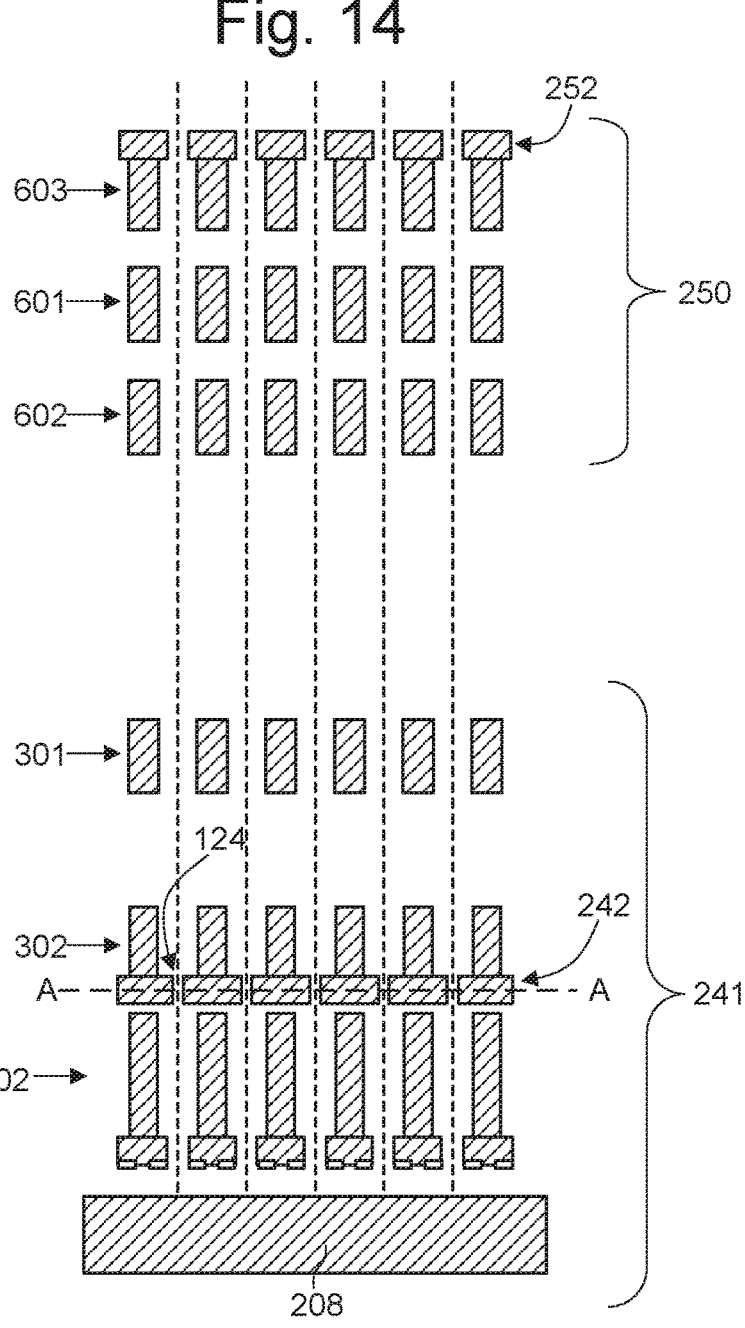
FIG. 14 is a schematic side sectional view of portions of electrodes forming objective lenses with a beam shaping limiter and control lenses with an upper beam limiter.
Figure 15:
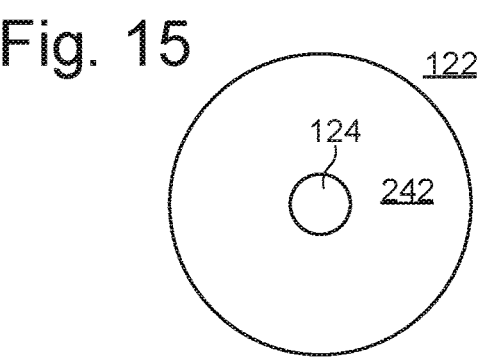
FIG. 15 is a schematic magnified top sectional view relative to plane A-A in FIG. 14 showing a beam-limiting aperture in the beam shaping limiter.

In some embodiments, as exemplified in FIGS. 14 and 15, the planar elements of the objective lens array assembly further comprise a beam shaping limiter 242. The beam shaping limiter 242 defines an array of beam-limiting apertures 124. The beam shaping limiter 242 may be referred to as a lower beam limiter, lower beam-limiting aperture array or final beam-limiting aperture array. The beam shaping limiter 242 may comprise a planar element in the form of a plate (which may be a plate-like body) having a plurality of apertures. The beam shaping limiter 242 is down-beam from at least one planar element (electrode), optionally from all planar elements, of the control lens array 250. In some embodiments, the beam shaping limiter 242 is down-beam from at least one planar element (electrode), optionally from all planar elements, of the objective lens array 241. The plate of the beam shaping limiter 242 may be connected to an adjacent plate electrode array of the objective lens by an isolating element, such as a spacer which may comprise ceramic or glass.

In an arrangement, the beam shaping limiter 242 is structurally integrated with an electrode 302 of the objective lens array 241. That is, the plate of the beam shaping limiter 242 is connected directly to the adjacent plate electrode array of the objective lens array 241. Desirably, the beam shaping limiter 242 is positioned in a region of low electrostatic field strength. Each of the beam-limiting apertures 124 is aligned with a corresponding objective lens in the objective lens array 241. The alignment is such that a portion of a sub-beam from the corresponding objective lens can pass through the beam-limiting aperture 124 and impinge onto the sample 208. Each beam-limiting aperture 124 has a beam limiting effect, allowing only a selected portion of the sub-beam incident onto the beam shaping limiter 242 to pass through the beam-limiting aperture 124. The selected portion may be such that only a portion of the respective sub-beam passing through a central portion of respective apertures in the objective lens array reaches the sample. The central portion may have a circular cross-section and/or be centered on a beam axis of the sub-beam.

In some embodiments, the electron-optical system further comprises an upper beam limiter 252. The planar elements of the objective lens array assembly may comprise the upper beam limiter 252. The upper beam limiter 252 defines an array of beam-limiting apertures. The upper beam limiter 252 may be referred to as an upper beam-limiting aperture array or up-beam beam-limiting aperture array. The upper beam limiter 252 may comprise a planar element in the form of a plate (which may be a plate-like body) having a plurality of apertures. The upper beam limiter 252 forms sub-beams from a beam of charged particles emitted by the source 201. Portions of the beam other than those contributing to forming the sub-beams may be blocked (e.g. absorbed) by the upper beam limiter 252 so as not to interfere with the sub-beams down-beam. The upper beam limiter 252 may be referred to as a sub-beam defining aperture array.

In embodiments not comprising a condenser lens array, as exemplified in FIGS. 3, 5 and 6, the upper beam limiter 252 may form part of the objective lens array assembly. The upper beam limiter 252 may, for example, be adjacent to and/or integrated with the control lens array 250 (e.g. adjacent to and/or integrated with an electrode 603 of the control lens array 250 nearest to the source 201 as shown in FIG. 14). The upper beam limiter 252 may be the most-up-beam electrode of the control lens array 250. In some embodiments, the upper beam limiter 252 defines beam-limiting apertures that are larger (e.g. have larger cross-sectional area) than beam-limiting apertures 124 of the beam shaping limiter 242. The beam-limiting apertures 124 of the beam shaping limiter 242 may thus be of smaller dimension (i e smaller area and/or smaller diameter and/or smaller other characteristic dimension) than the corresponding apertures defined in the upper beam limiter 252 and/or in the objective lens array 241 and/or in the control lens array 250.

In embodiments having a condenser lens array 231, as exemplified in FIG. 8, the upper beam limiter 252 may be provided adjacent to and/or integrated with the condenser lens array 231 (e.g. adjacent to and/or integrated with an electrode of the condenser lens array 231 nearest to the source 201). It is desirable generally to configure the beam-limiting apertures of the beam shaping limiter 242 to be smaller than beam-limiting apertures of all other beam limiters defining beam-limiting apertures up-beam from the beam shaping limiter 242.

The beam shaping limiter 242 is desirably configured to have a beam-limiting effect (i.e. to remove a portion of each sub-beam that is incident on the beam shaping limiter 242). The beam shaping limiter 242 may, for example, be configured to ensure that each sub-beam exiting an objective lens of the objective lens array 241 has passed through the center of the respective objective lens. In contrast to alternative approaches, this effect can be achieved using the beam shaping limiter 242 without requiring a complex alignment procedure to ensure that sub-beams incident onto the objective lenses are well aligned with the objective lenses. Moreover, the effect of the beam shaping limiter 242 will not be disrupted by column alignment actions, source instabilities or mechanical instabilities. Further the beam shaping limiter 242 reduces the length over which the scanning operates on the sub-beams. The distance is reduced to the length of the beam path from the beam shaping limiter 242 to the sample surface.

In some embodiments, a ratio of a diameter of a beam-limiting aperture in the upper beam limiter 252 to a diameter of the corresponding beam-limiting aperture 124 in the beam shaping limiter 242 is equal to or greater than 3, optionally equal to or greater than 5, optionally equal to or greater than 7.5, optionally equal to or greater than 10. In one arrangement, for example, a beam-limiting aperture in the upper beam limiter 252 has a diameter of about 50 microns and a corresponding beam-limiting aperture 124 in the beam shaping limiter 242 has a diameter of about 10 microns. In another arrangement, a beam-limiting aperture in the upper beam limiter 252 has a diameter of about 100 microns and a corresponding beam-limiting aperture 124 in the beam shaping limiter 242 has a diameter of about 10 microns. It is desirable for only the part of the beam that has gone through the center of the objective lens to be selected by the beam-limiting aperture 124. In the example shown in FIG. 14, each objective lens is formed by the electrostatic field between electrodes 301 and 302. In some embodiments, each objective lens consists of two elementary lenses (each with focal length=4*beamEnergy/Efield): one at the bottom of electrode 301 (i.e. the bottom the up-beam electrode 301) and one at the top of electrode 302 (i.e. the top of the down-beam electrode 302). The dominant lens may be the one at the top of electrode 302 (as the beam energy may be small there, for example 2.5 kV compared to 30 kV close to electrode 301, which would make the lens approximately 12× stronger than the other). It is desirable for the portion of the beam passing though the center of the aperture at the top of electrode 302 to be passing through beam-limiting aperture 124. Because the distance in z between the top of electrode 302 and the aperture 124 is very small (typically 100 to 150 microns for example), even for relatively large angles of the beam the correct portion of the beam is selected.

In the particular example of FIGS. 14 and 15, the beam shaping limiter 242 is shown as an element formed separately from a bottom electrode 302 of the objective lens array 241. In other embodiments, the beam shaping limiter 242 may be formed integrally with a bottom electrode of an objective lens array 241 (e.g. by performing lithography to etch away cavities suitable for functioning as lens apertures and beam-blocking apertures on opposite sides of the substrate).

In some embodiments, the apertures 124 in the beam shaping limiter 242 are provided at a distance down-beam from at least a portion of a corresponding lens aperture in a bottom electrode of the corresponding objective lens array 241. The beam shaping limiter may be provided at a down-beam distance that may be equal to or larger than a diameter of the lens aperture, preferably at least 1.5 times larger than the diameter of the lens aperture, preferably at least 2 times larger than a diameter of the lens aperture.

It is generally desirable to position the beam shaping limiter 242 adjacent to the electrode of each objective lens that has the strongest lensing effect. In the example of FIGS. 14 and 15, the bottom electrode 302 will have the strongest lensing effect and the beam shaping limiter 242 is positioned adjacent to this electrode. Such an objective lens is a decelerating lens. In an objective lens array which is an accelerating lens, the up beam electrode 301 has the strongest lensing effect. The beam shaping limiter 242 is positioned adjacent to the up beam electrode 301. Where an objective lens array 241 comprises more than two electrodes, such as in an Einzel lens configuration with three electrodes, the electrode having the strongest lensing effect will typically be the middle electrode. In this case, it would be desirable to position the beam shaping limiter 242 adjacent to the middle electrode. Thus, at least one of the electrodes of the objective lens array 241 may be positioned down-beam of the beam shaping limiter 242. The electron-optical system may also be configured to control the objective lens array assembly (e.g. by controlling the potentials applied to the electrodes of the objective lens array) so that the beam shaping limiter 242 is adjacent to or integrated with an electrode of the objective lens array 241 having the strongest lensing effect of the electrodes of the objective lens array 241. In this context, strongest lensing effect is considered to mean the effect of the strongest lens of two or more lensing elements, i.e. electron optical elements, operating on an electron beam. The lensing effect is the extent to which the element (more typically) converges, or diverges, the electron beam on which it operates.

It is generally desirable also to position the beam shaping limiter 242 in a region where the electric field is small, preferably in a substantially field-free region. This avoids or minimizes disruption of a desired lensing effect by the presence of the beam shaping limiter 242.

It is desirable to provide the beam shaping limiter 242 up-beam of the detector (e.g. detector module 402), as exemplified in FIGS. 14 and 15. Providing the beam shaping limiter 242 up-beam of the detector ensures that the beam shaping limiter 242 will not obstruct charged particles emitted from the sample 208 and prevent them from reaching the detector. In embodiments where the detector is provided up-beam of all of the electrodes of the objective lens array 241, it is therefore desirable also to provide the beam shaping limiter 242 up-beam of all of the electrodes of the objective lens array 241 or even up-beam of one or more of the electrodes of the control lens array 250. In this scenario, it may be desirable to position the beam shaping limiter 242 as close as possible to the objective lens array 241 while still being up-beam of the detector. The beam shaping limiter 242 may thus be provided directly adjacent to the detector in the up-beam direction.

The objective lens array assemblies described above that have a beam shaping limiter 242 down-beam from at least one electrode of a control lens array 250 and/or at least one electrode of an objective lens array 241 are examples of a class of objective lens arrangement. Embodiments of this class comprise an objective lens arrangement for an electron-optical system for focusing a multi-beam on a sample 208. The objective lens arrangement comprises an up-beam lensing aperture array (e.g. an electrode 301 of the objective lens array 241 nearest to the source 201, as depicted in FIG. 14). The objective lens arrangement further comprises a down-beam lensing aperture array (e.g. an electrode 302 of the objective lens array 241 furthest from the source 201, as depicted in FIG. 14). The down-beam lensing aperture array (e.g. electrode 302) and the up-beam lensing aperture array (e.g. electrode 301) operate together to lens sub-beams of the multi-beam. A beam-limiting aperture array (e.g. the beam shaping limiter 242 depicted in FIG. 14) is provided in which the apertures (e.g. the beam-limiting apertures 124 in FIG. 14) are of smaller dimension (i e smaller area and/or smaller diameter and/or smaller other characteristic dimension) than apertures in the up-beam lensing aperture array and the down-beam lensing aperture array. The apertures of the beam-limiting aperture array are configured to limit each sub-beam to a portion of the sub-beam that has passed through central portions of respective apertures in the up-beam lensing aperture array and the down-beam lensing aperture array. As described above, the beam-limiting aperture array may thus ensure that each sub-beam exiting an objective lens of the objective lens arrangement has passed through the center of the respective lens.

In any of the arrangements described herein it is possible for undesirable off-axis aberrations to occur in the multi-beam if corrective action is not taken. Off-axis aberrations in this context are understood to encompass any imperfection in or across the multi-beam that varies as a function of position within a plane perpendicular to a principle axis of the multi-beam (e.g. from one sub-beam to another sub-beam).

Off-axis aberrations in the multi-beam may comprise field curvature in the multi-beam (e.g. field curvature between different sub-beams) That is the focus plane is different for different sub-beams of the multi-beam so that a multi-beam with a field curvature error would have just some of the sub-beams in focus in the same focal plane, for example on a sample Off-axis aberrations in the multi-beam may comprise astigmatism (where beams propagating in perpendicular planes have different foci).

Off-axis aberrations in the multi-beam may comprise distortion (e.g. positional error associated with individual sub-beams) caused by telecentricity error (e.g. angular error in the directions of propagation of the sub-beams) The distortion may be characterized by errors in the positions of axes of sub-beams as they pass through the sample and/or through other reference planes perpendicular to a principle axis of the multi-beam.

Off-axis aberrations in the multi-beam may comprise coma

Off-axis aberrations, particularly field curvature and astigmatism, may be particularly significant in embodiments that use a macro collimator 270 (e.g. as described above with reference to FIG. 3-5). Typical values for field curvature in such exemplary embodiments may be in the range of 1-2 mm defocus on an object side of the macro collimator 270. Typical values for astigmatism in such embodiments may be in the range of 1-2 mm focus difference on the object side of the macro collimator 270 between the axial and azimuthal directions. The field curvature and astigmatism in embodiments that use a condenser lens array 231 instead of a macro collimator 270 (e.g. as described above with reference to FIG. 8) may be smaller but correction is still desirable. The distortion caused by the macro collimator 270 may typically be in the range of 0.5 to 1 mrad (expressed as a telecentricity error). For an objective lens array assembly having a thickness of the order of 10 mm, the distortion could therefore require displacements of apertures by as much as 10 microns for the radially outermost sub-beams. The value of 10 microns may be determined by the product of the thickness of the objective lens array and the upper limit of the telecentric error (i.e. 10 mm×1 mrad=10 micron). Coma is typically expected to be very small.

In some embodiments, apertures of one or more of the planar elements (e.g. electrodes) in an objective lens array assembly are configured to compensate (e.g. at least partially) for off-axis aberrations in the multi-beam. This approach may be used with any of the objective lens array assemblies described herein. The apertures of the planar elements may be configured to compensate for the off-axis aberrations by being shaped, sized and/or positioned to compensate for the off-axis aberrations.

The shaping, sizing and/or positioning of the apertures may be applied to multiple apertures within one planar element, for example within one of the electrodes of the objective lens array 241. This may lead to apertures in the planar element being provided with a range of different shapes, sizes and/or positions (relative to nominal positions) within the planar element. The shaping, sizing and/or positioning of the apertures may be applied to multiple apertures within each of plural planar elements, for example plural electrodes of the objective lens array 241. An array of apertures defined in one of the planar elements may therefore have a different geometry from an array of apertures defined in another of the planar elements. The shaping, sizing and/or positioning of apertures in the objective lens array assembly to compensate for off-axis aberrations is typically most effective when applied to apertures defined in the planar element (electrode) configured to provide the strongest lensing effect in the objective lens array assembly (e.g. in the objective lens array 241). It is thus desirable to provide the apertures shaped, sized and/or positioned to compensate for off-axis aberrations in the multi-beam in at least, preferably in only, the planar element (electrode) that is configured to provide the strongest lensing effect in the objective lens array assembly (e.g. in the objective lens array 241).

Figure 16:
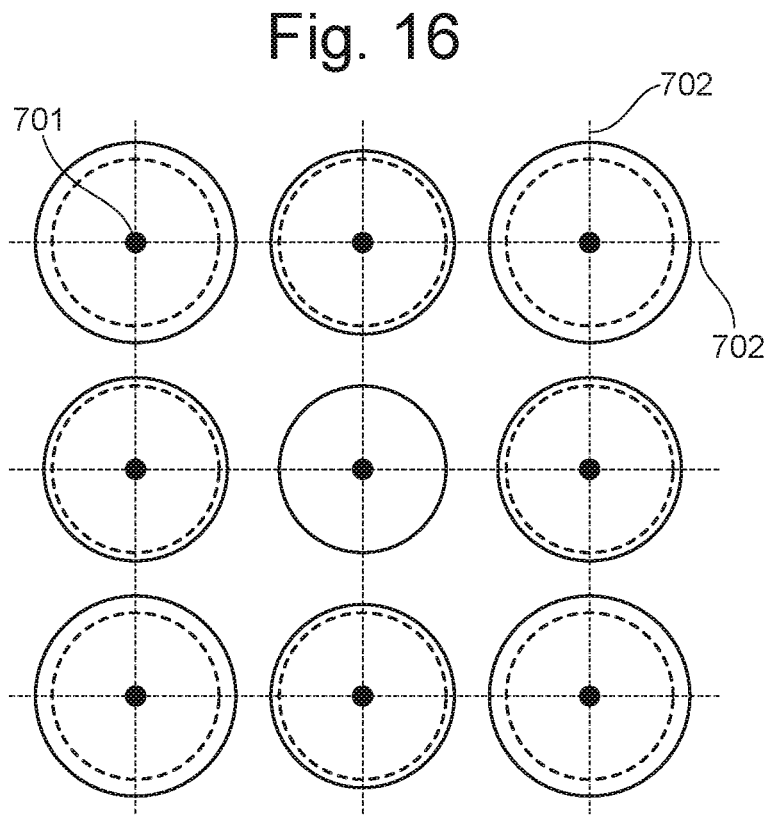
FIG. 16 is a top view of a portion of an example assembly comprising planar elements defining apertures with a range of different aperture areas for compensating field curvature.
Figure 17:
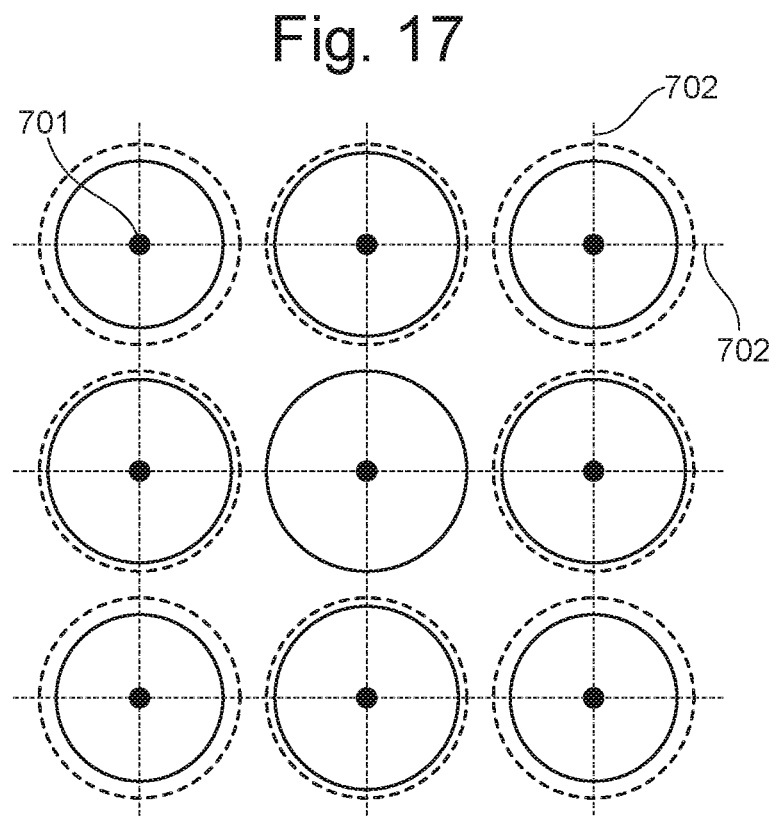
FIG. 17 is a top view of a portion of a further example assembly comprising planar elements defining apertures with a range of different aperture areas for compensating field curvature.

As depicted schematically in FIGS. 16 and 17 for an exemplary case of a planar element in the objective lens array 241, in some embodiments at least a subset of the apertures (defined in the planar elements of the objective lens array assembly) have a range of different aperture areas. The range of different aperture areas may be present in one and the same planar element or in each of multiple planar elements. The variations in aperture area depicted in FIGS. 16 and 17 are exaggerated for clarity and will in practice be smaller than depicted. For example, a typical variation in the aperture area might correspond to a diameter deviation in a range of 0 to 2 micron for a circular aperture having a diameter of 50 microns. (In such an arrangement the diameter deviation typically may scale down with radial distance squared relative to the principle axis, thereby becoming close to zero close to the principle axis). The solid line circles represent the apertures having a range of different aperture areas. The broken line circles represent unmodified aperture sizes to assist with visual recognition of the depicted variations in aperture area. The different aperture areas may be described by reference to the diameter of a circle that would have the same aperture area. Thus, aperture areas may be described by reference to a diameter even if the corresponding apertures are not exactly circular. The range of different aperture areas are selected to compensate for off-axis aberrations in the multi-beam. The off-axis aberrations compensated for by the range of different aperture areas may comprise field curvature. The variations will often involve increases in aperture area as a function of increasing distance from a principle axis of the multi-beam (as depicted schematically in FIG. 16, with the principle axis being perpendicular to the page and passing through the center-most aperture). It is also possible for appropriate corrections to involve decreases in aperture area as a function of increasing distance from a principle axis of the multi-beam (as depicted schematically in FIG. 17). In the examples shown in FIGS. 16 and 17, the apertures are arranged on a regular grid defined by grid points 701 and grid lines 702.

Figure 18:
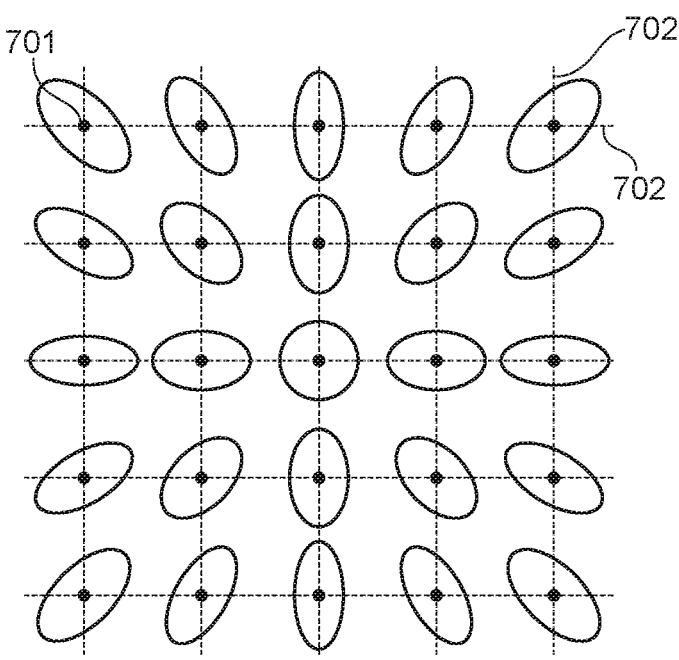
FIG. 18 is a top view of a portion of a further example assembly comprising planar elements defining apertures with a range of different ellipticities for compensating astigmatism.
Figure 19:
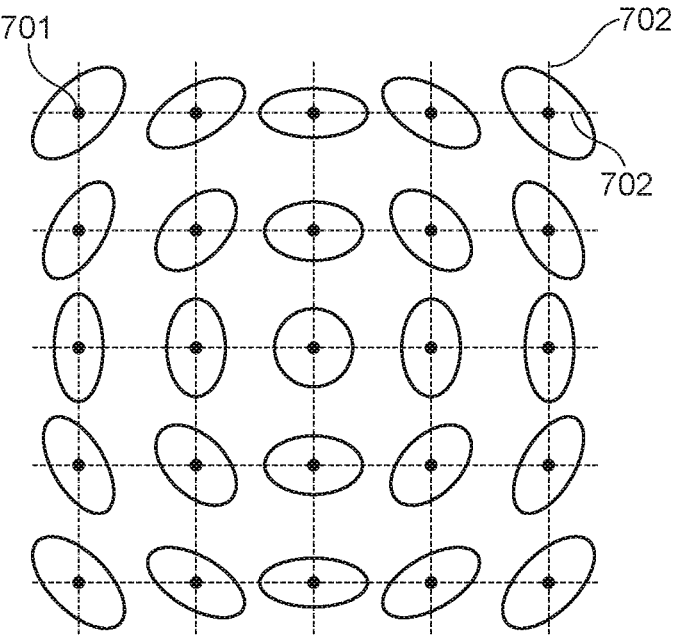
FIG. 19 is a top view of a portion of a further example assembly comprising planar elements defining apertures with a range of different ellipticities for compensating astigmatism.

As depicted schematically in FIGS. 18 and 19 for an exemplary case of a planar element in the objective lens array 241, in some embodiments at least a subset of apertures (defined in the planar elements of the objective lens array assembly) have a range of different ellipticities. The range of different ellipticities may be present in one and the same planar element or in each of multiple planar elements. The variations in ellipticity depicted in FIGS. 18 and 19 are exaggerated for clarity and will in practice be smaller than depicted. For example, a typical variation in the ellipticity might correspond to up to about 0 to 2 microns of variation in major axis size relative to an initially circular aperture having a diameter of 50 microns. The range of different ellipticities are selected to compensate for off-axis aberrations in the multi-beam. The off-axis aberrations compensated for by the range of different ellipticities may comprise astigmatism. The variations may involve increases in the size of radially oriented axes, which may be major axes, of apertures as a function of increasing distance from a principle axis of the multi-beam (as depicted schematically in FIG. 18 with the principle axis being perpendicular to the page and passing through the centermost aperture). It is also possible for appropriate correction to involve increases in the size of azimuthally oriented axes, which may be major axes, of apertures as a function of increasing distance from the principle axis of the multi-beam (as depicted schematically in FIG. 19).

The field curvature and astigmatism on an object side of a collimator (e.g. a macro collimator 270 such as that depicted in FIGS. 3 and 5) is related in magnitude to the field curvature and astigmatism at the sample plane by a factor equal to the total linear magnification divided by the total angular magnification. The total linear magnification is given by Mtot. The total angular magnification is given by Ma_tot. For typical values of Mtot=$\frac{1}{15}$ and Ma_tot=50, field curvature and astigmatism in the range of 1 to 2 mm on the object side of the collimator thus correspond to field curvature and astigmatism in the range of 1.3 to 2.7 micron on the image side of the objective lens (because 1.3=1000/(15×50) and 2.7=2000/(15×50)). The precise demagnification used depends on the resolution and landing energy that is targeted, as well as the characteristics of the source 201.

The focal length of a decelerating electrostatic lens will be dominated by the aperture lens formed by the electrode at the lowest beam energy. This focal length is roughly 4*U·beam/E·field (U·beam=beam energy at the aperture lens, E·field is the electrostatic field). However, this focal length has also a slight dependency on the aperture area of the lens (lens diameter). Typically, this leads to the focal length being larger by about 0.6×L, where L is the lens diameter, than an estimate obtained assuming that the focal length is roughly 4*U·beam/E·field. Consequently, in order to correct a field curvature at sample level of the order of a micron or a few microns (e.g. 0.5-5 micron), adjusting the lens diameter by a corresponding amount (e.g. 0.5-5 microns) divided by 0.6 would be sufficient. This is still relatively small compared to typical practical lens diameters of 50 to 200 micron for example. Such correction is thus practical.

The calculation above also shows that if the correction is applied by a lens array upbeam of the objective lens array assembly (i.e. before significant demagnification), variations of lens diameters in the range of millimeters would be required. Variations of such magnitude are not practical where lens pitches are significantly smaller than one millimeter.

Figure 20:
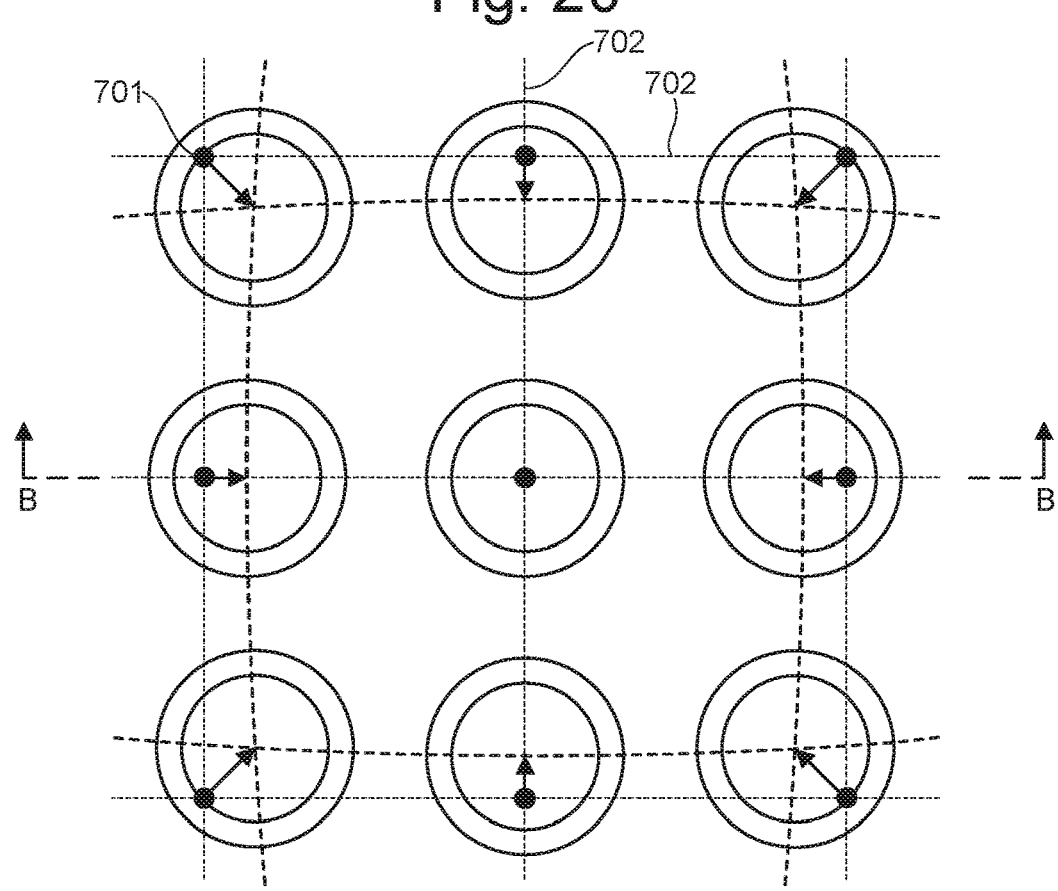
FIG. 20 is a sectional view relative to plane A-A shown in FIG. 21 of a portion of a further example assembly comprising planar elements defining apertures that are displaced with respect to nominal positions to correct for distortion caused by telecentricity error.
Figure 21:
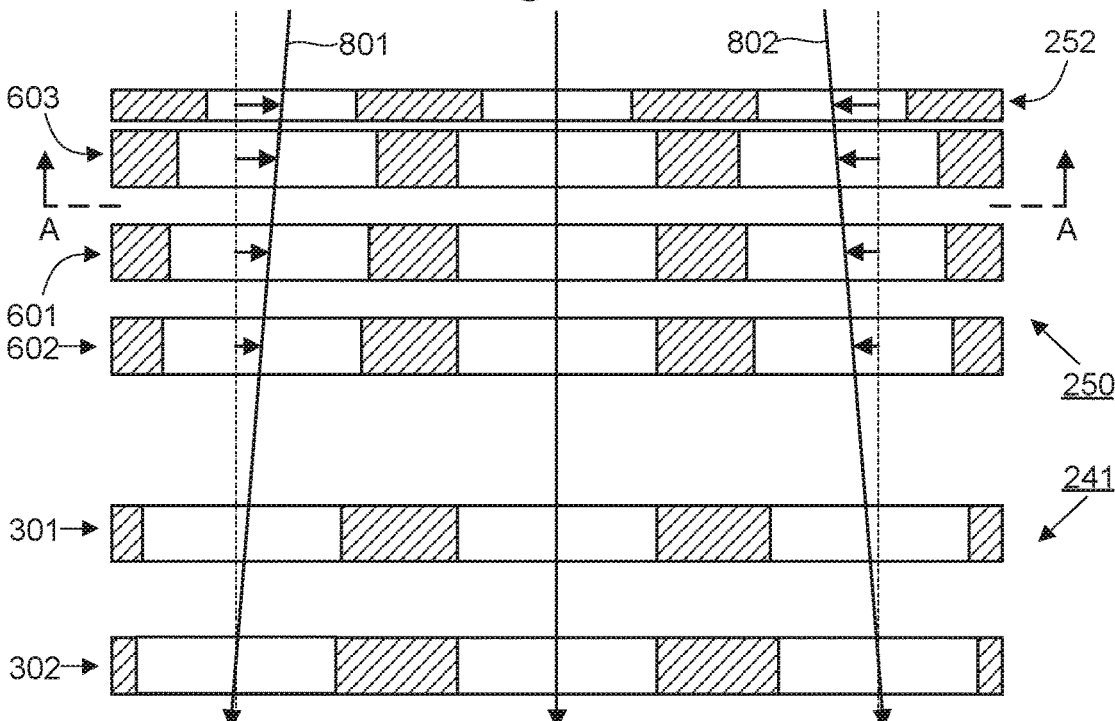
FIG. 21 is a sectional view of the arrangement of FIG. 20 relative to plane B-B.

In some embodiments, as exemplified in FIGS. 20 and 21, at least a subset of the apertures (defined in the planar elements of the objective lens array assembly) are displaced relative to nominal positions, for example in the plane of the respective elements. Such displacement may be transverse to the path of the multi-beam. Such nominal positions may correspond to the intersection between grid lines of a grid. The apertures are each displaced with respect to a corresponding nominal position on the grid. The displacements are selected to compensate for off-axis aberrations in the multi-beam. The nominal positions may be provided on a regular grid. The regular grid may comprise a rectangular, square, or hexagonal grid for example. In the example shown, the nominal positions are indicated by the grid points 701 and grid lines 702. The nominal positions may represent positions corresponding to an ideal configuration in which there are no off-axis aberrations. The displacements from nominal positions may be present in one and the same planar element or in each of multiple planar elements. The displacements depicted in FIGS. 20 and 21 are exaggerated for clarity and will in practice be smaller than depicted. The displacements cause the apertures to lie on a grid (depicted by thick broken lines) that is distorted relative to the nominal grid (depicted by grid lines 702). The off-axis aberrations compensated for by the displacements may comprise distortion caused by telecentricity error. The displacements may be radially inwards as exemplified in FIGS. 20 and 21 (towards a principle axis of the multi-beam) or radially outwards. In both cases, the size of the displacements may increase with radial distance. In the simplified example of FIGS. 20 and 21 this leads to the corner apertures being displaced more than the side apertures.

As exemplified in FIGS. 20 and 21, the displacements of the apertures may be provided in embodiments in which the objective lens array assembly comprises a control lens array 250. In embodiments of this type, apertures may be displaced in either or both of the control lens array 250 and the objective lens array 241. In the example shown, the control lens array 250 comprises three electrodes 601-603. The control lens array 250 may be arranged and configured to operate in any of the ways described above with reference to FIGS. 3-15. Apertures are displaced in all three of the electrodes 601-603 in this example. Desirably, for each of at least a subset of the sub-beam paths, all of the apertures in the objective lens array assembly that are positioned along the sub-beam path are displaced except for an aperture in a planar element (electrode) that provides a strongest lensing effect. In the example shown in FIG. 21, where the objective lens array 241 comprises two planar elements (electrodes 301 and 302) providing a decelerating lens effect, the lowermost electrode 302 will provide the strongest lensing effect. In another arrangement the two planar elements provide an accelerating lens in which the uppermost electrode 301 provides the strongest lensing effect. In an alternative example where the objective lens array 241 comprises an Einzel lens, a center electrode may provide the strongest lensing effect. The displacements are preferably selected, as shown in FIG. 21, such that a sub-beam that passes through the center of an aperture in the electrode providing the strongest lensing effect (the electrode 302 in the example shown) will also have passed through centers of the corresponding displaced apertures upbeam. As shown in FIG. 21, in the present example the three leftmost apertures in the electrodes 601-603 and 301 are displaced to the right (as indicated by horizontal arrows) so as to be aligned with the sub-beam 801 passing through the center of the corresponding aperture in the electrode 302. The three rightmost apertures in the electrodes 601-603 and 301 are displaced to the left (as indicated by horizontal arrows) so as to be aligned with the sub-beam 802 passing through the center of the corresponding aperture in the electrode 302. The apertures in the lowermost electrode 302, on the other hand, are not displaced in this example.

As further exemplified in FIGS. 20 and 21, the displacements of the apertures may be provided in embodiments in which the objective lens array assembly comprises an upper beam limiter 252. The upper beam limiter 252 is up-beam from the control lens array 250. The upper beam limiter 252 defines an array of beam-limiting apertures. The upper beam limiter 252 may be arranged and configured to operate in any of the ways described above with reference to FIGS. 3-15. In embodiments of this type, the displacement of the apertures may be applied both to apertures defined in one or more electrodes 601-603 of the control lens array 250 and beam-limiting apertures in the upper beam limiter 252. At least a subset of the apertures defined in the control lens array 250 and upper beam limiter 252 may thus be provided at positions that are displaced relative to nominal positions, with the displacements being selected to compensate for off-axis aberrations in the multi-beam. Apertures are displaced in all three of the electrodes 601-603 of the control lens array 250 and in the upper beam limiter 252 in this example. The displacements may be selected such that sub-beam paths passing through the centers of apertures in the planar element providing the strongest lensing effect will also have passed through centers of corresponding displaced apertures upbeam.

As shown in the arrangement of FIGS. 20 and 21 all apertures in the planar elements, e.g. electrodes, of all elements in the sub-beam paths 801, 802 (such as the objective lens array 241, control lens and the upper beam limiter 252) are aligned. That is the apertures of the sub-beam paths are aligned with respect to the "telecentricity" of the illumination such that the beam goes through the center of all apertures in the planar elements. Although as described above it is preferably that the planar element providing the strongest lensing effect (so the bottom electrode of the objective lens) is selected as the reference planar element, any of the planar elements may be selected as a reference. In selecting any one planar element as a reference, the planar elements may be shifted in total and yet the apertures of the other planar elements remain may aligned with the beam paths. This is because alignment is relative. In fact in terms of aberrations it would not matter if any other planar element were to be selected as reference. Therefore, the reference may be the frame of reference of an observer or the sample. In selecting the perspective of the sample as a reference, the grid defined by the relative positions of the sub-beam paths in the multi-beam can be considered as an ideal grid or regular grid. Taking such a reference is helpful when applying a scanning strategy to the multi-beam.

Figures 22, 23:
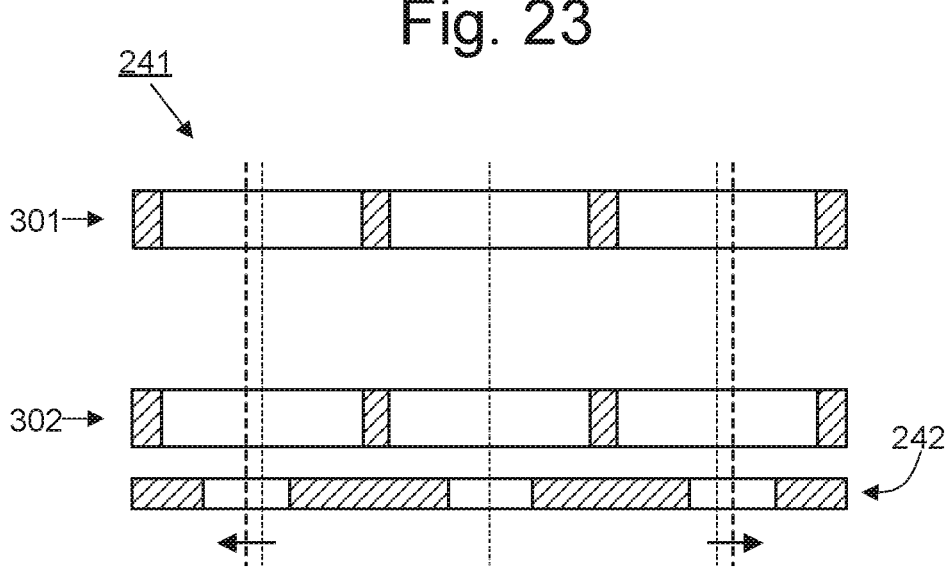
FIG. 22 is a bottom view of a portion of an example assembly in which beam-limiting apertures of a beam shaping limiter are provided at positions that are displaced relative to respective central axes of apertures in up-beam planar elements.
FIG. 23 is a side sectional view of the arrangement of FIG. 22 relative to plane A-A.

In some embodiments, as exemplified in FIGS. 22 and 23, the planar elements of the objective lens array assembly comprise a beam shaping limiter 242 down-beam from at least one planar element forming the objective lens array 241. The beam shaping limiter 242 defines an array of beam-limiting apertures. The beam shaping limiter 242 may be arranged and configured to operate in any of the ways described above with reference to FIGS. 3-15, particularly FIGS. 14 and 15. In the example shown, the planar elements forming the objective lens array 241 comprise two electrodes 301-302. The beam shaping limiter 242 is down-beam from both of the electrodes 301-302. In some embodiments, at least a subset of the beam-limiting apertures defined in the beam shaping limiter 242 are provided at positions that are displaced relative to respective central axes 704 of apertures in up-beam planar elements 301-302 forming the objective lens array 241. The displacements may be selected to compensate for off-axis aberrations in the multi-beam. The off-axis aberrations compensated for by the displacements may comprise coma. If the compensation of coma increases astigmatism and/or field curvature these effects may be compensated for by varying the aperture areas and/or ellipticities of apertures as described above with reference to FIGS. 16-19.

Thus, in order to introduce a coma compensation to correct for the coma aberration, as described previously, the electrode of the strongest element of the objective lens should be shifted with respect to the path. As described with respect to FIGS. 20 and 21, prior to the coma compensation, the apertures in all planar elements of the objective lens array assembly are positioned to that sub-beams path pass through the center of each corresponding aperture. Thus, in a frame of reference of the sample, the multi-beam arrangement corresponds to a regular or ideal grid. The introduction of the coma compensation means that the apertures of the beam shaping limiter 242 are displaced so that the sub-paths are misaligned with the center of the corresponding apertures in the beam shaping limiter 242. Thus misalignment will introduce the coma compensation and many aberrations, as mentioned, such as distortion or telecentricity error, field curvature and astigmatism. Since the introduction of telecentricity error, field curvature and astigmatism may require further correction in the manner described above, it is preferable that coma is neglectable. However, coma aberrations can be corrected if required.

Therefore elements of an objective lens array assembly may have apertures modified in terms of position, ellipticity and/or aperture area relative to the beam arrangement so as to compensate for off axis aberrations such as: field curvature, astigmatism, telecentricity error and/or coma.

Figure 24:
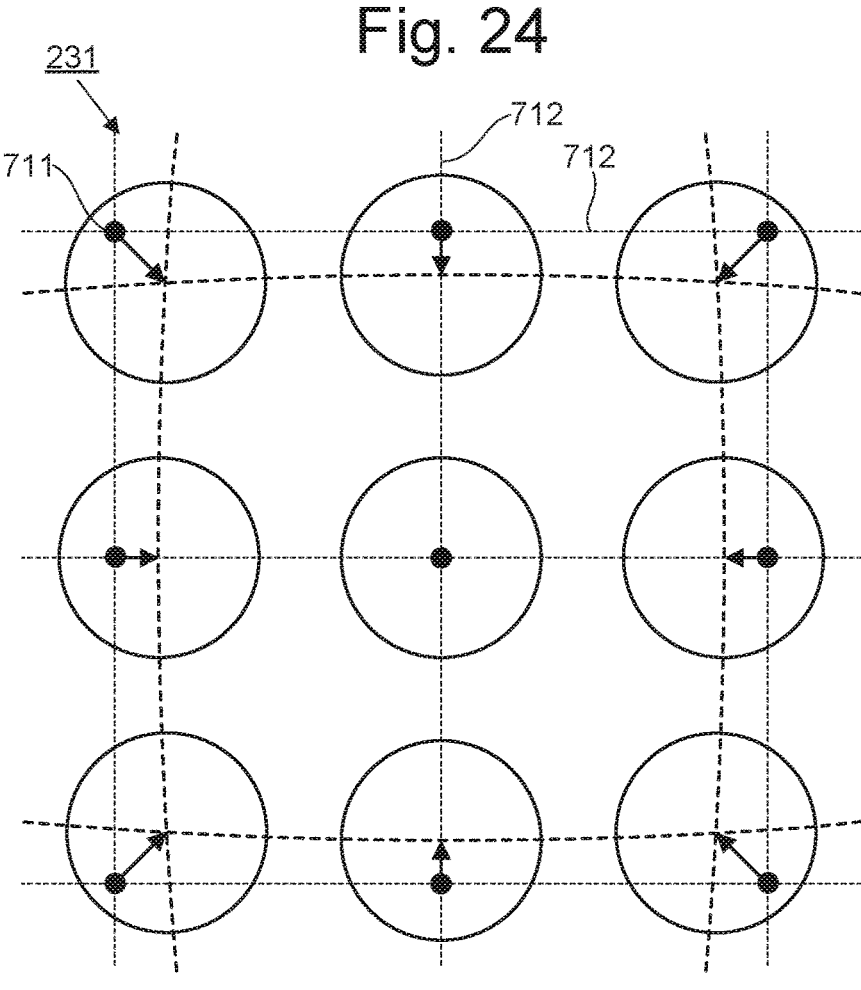
FIG. 24 is a bottom view of a portion of a condenser lens array in which apertures are displaced with respect to nominal positions to correct for distortion caused by telecentricity error.

In embodiments comprising a condenser lens array 231, for example as described above with reference to FIG. 8, the condenser lens array 231 may be configured to displace positions of at least a subset of sub-beams at the objective lens array 241 relative to nominal positions of the sub-beams. The displacements may be selected to correct for off-axis aberrations in the multi-beam. The off-axis aberrations corrected for by the displacements may comprise distortion caused by telecentricity error. As depicted schematically in FIG. 24, the displacements of the sub-beams may be at least partially implemented by providing respective condenser lenses at positions in the condenser lens array that are displaced relative to nominal positions of the condenser lenses. The nominal positions may be provided on a regular grid. The regular grid may comprise a rectangular, square, or hexagonal grid for example. In the example shown, the nominal positions are indicated by the grid points 711 and grid lines 712. The nominal positions may represent positions corresponding to an ideal configuration in which there are no off-axis aberrations. The displacements from nominal positions may be present in one and the same planar element or in each of multiple planar elements. The displacements depicted in FIG. 24 are exaggerated for clarity and will in practice be smaller than depicted. The displacements cause the apertures to lie on a grid (depicted by thick broken lines) that is distorted relative to the nominal grid (depicted by grid lines 712). Alternatively or additionally, one or more deflectors may be used to at least partially implement the displacements of the sub-beams.

Any of the embodiments described above in which apertures in one or more planar elements forming the objective lens array 241 are displaced relative to nominal positions may be used to compensate coma. This approach may be particularly desirable in embodiments comprising a condenser lens array 231, for example as described above with reference to FIG. 8. In such an electron-optical design, the condenser lens array 231 or a beam limiting aperture array associated with the condenser lens array 231 shapes the sub-beams of the multi-beam arrangement. Such a design may not feature a beam shaping limiter in the objective lens array assembly of the electron-optical design (which, as described above, can be used to compensate for coma). In embodiments using a condenser lens array 231 (e.g. as described above with reference to FIG. 8), the objective lens array assembly may be configured to compensate for other off-axis aberrations in the multi-beam in any of the ways described above for embodiments that do not include a condenser lens array 231. The objective lens array assembly may, for example, be configured to correct for astigmatism, field curvature and/or distortion (e.g. caused by telecentricity error).

Figure 25:
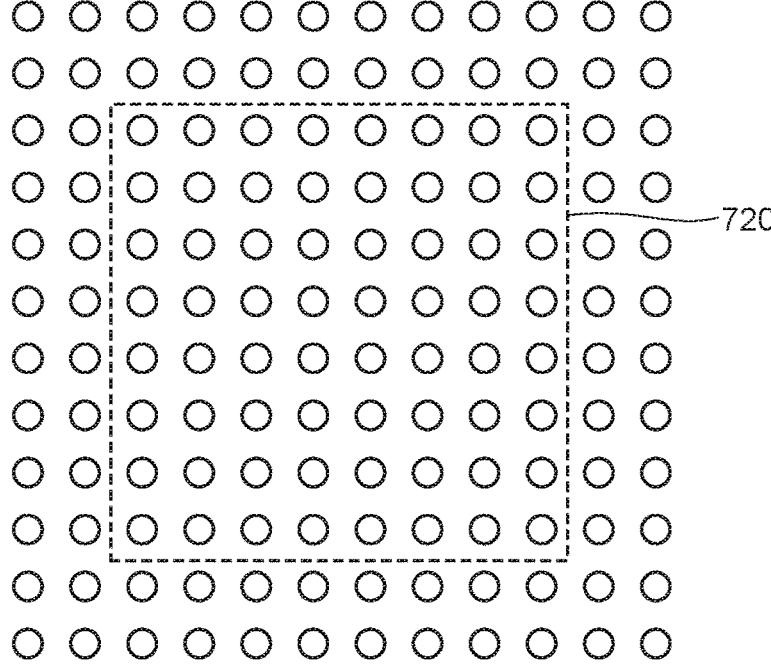
FIG. 25 is a top view of a portion of an example planar element comprising dummy apertures.

As depicted schematically in FIG. 25, any of the embodiments described herein may be adapted so that the multi-beam passes through only a centrally located subset of the apertures defined in the planar elements. FIG. 25 depicts an illustrative planar element (e.g. an electrode in an objective lens array 241) in which the multi-beam passes through only the apertures within the central region surrounded by the broken line box 720. Sub-beams pass through all of the apertures within the broken line box 720 and through none of the apertures outside of the broken line box 720. The apertures outside of the broken line box 720 may be referred to as dummy apertures. Although no sub-beams pass through the dummy apertures, their presence may help to reduce or eliminate edge effects that might occur if the dummy apertures were not provided. Therefore each aperture of the array defined in planar plate through which a sub-beam passes in operation is surrounded by apertures. An aperture through which a sub-beam passes is away from the edge of the aperture array. Any of the above-described shaping, sizing and/or positioning of apertures to compensate for off-axis aberrations may also be applied to dummy apertures.

In some embodiments, electrical fields applied in the objective lens array during the projecting of the sub-beams towards the sample may cause one or more of the planar elements (e.g. electrodes) in the objective lens array assembly to distort. The objective lens array 241 may be distorted by the electrical fields for example. The distortion may be referred to as bow. The distortion will typically arise from an attractive force between electrodes so that the distance between the electrodes becomes smaller Making the distance between the electrodes smaller will increase the electrostatic field strength between the electrodes. Increasing the electrostatic field strength will lead to a shorter focal distance. This is the case for both a decelerating objective lens and an Einzel objective lens. For a decelerating objective lens, the lens itself will additionally move upwards. This because the dominant lens is formed by the lowest electrode. Such a lowest electrode will bend upwards. For an Einzel objective lens the dominant lens is formed by the central electrode, which will not bend. This is due to symmetry of the electrostatic field above and below the center electrode. The effect of the distortion of the lens electrodes is a field curvature. In some embodiments, the objective lens array 241 is configured so that the distortion at least partially compensates for field curvature in the multi-beam. The objective lens array 241 and the driving of the objective lens array 241 may thus be configured so that a contribution to field curvature is opposite in sign to contributions to field curvature from other sources. This will typically be the case in embodiments where a macro collimator 270 is used because the field curvature contributed by the macro collimator 270 will be opposite in sign to the field curvature contributed by the distortion of the electrodes in the objective lens array assembly. In some embodiments, the distortion compensates for a majority, preferably for substantially all, of the field curvature in the multi-beam from other sources. In some embodiments, the aperture areas of planar elements are also varied as described above to compensate for field curvature (optionally including field curvature contributed by the electrostatic field induced distortion in the objective lens array 241). As a consequence, the field curvature aberrations that the electron-optical column can manage may be larger than may be achieved by either the bowing within the objective lens array or the modification of the size, position and/or ellipticity, preferably size distribution, can alone.

In the embodiments disclosed and described in FIGS. 16-25, aperture arrays are shown with a limited number of apertures, for example nine or twenty-five. However, it is intended that these figures are exemplary, and the aperture arrays may have any number of apertures, for example as many as 20,000. The apertures may be arranged in an array along a grid that may be rectangular, such as square, or hexagonal.

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies and or current supplies) to control the component to manipulate the charged particle beam in this manner. For example, a voltage supply may be electrically connected to one or more components to apply potentials to the components, such as in a non-limited list the control lens array 250, the objective lens array 241, the condenser lens 231, correctors, collimator element array 271 and scan deflector array 260, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

References to upper and lower, up and down, above and below should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

An assessment tool according to some embodiments of the disclosure may be a tool which makes a qualitative assessment of a sample (e.g. pass/fail), one which makes a quantitative measurement (e.g. the size of a feature) of a sample or one which generates an image of map of a sample. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron-optical column 40 may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector.

References to elements being aligned along a beam path or sub-beam path are understood to mean that the respective elements are positioned along the beam path or sub-beam path.

References to optics are understood to mean electron-optics.

Reference in the specification to control of the electron-optical elements such as control lenses and objective lenses is intended to refer to both control by the mechanical design and set operating applied voltage or potential difference, i.e. passive control as well as to active control, such as by automated control within the electron-optical column or by user selection. A preference for active or passive control should be determined by the context.

While the embodiments of the present disclosure have been described in connection with various examples, other variations will be apparent to those skilled in the art from consideration of the specification and practice of the technology disclosed herein. It is intended that the specification and examples be considered as exemplary only, with a true scope and spirit of the invention being indicated by the following claims and clauses.

There are provided the following clauses:

Clause 1: An objective lens array assembly for an electron-optical system of a charged-particle tool, the objective lens array assembly being configured to focus a multi-beam of sub-beams on a sample and comprising: planar elements defining a plurality of apertures aligned along sub-beam paths of the multi-beam and comprising an objective lens array configured to project the multi-beam towards a sample, wherein the apertures of one or more of the planar elements are configured to compensate for off-axis aberrations in the multi-beam.

Clause 2. The assembly of clause 1, wherein the apertures of one or more of the planar elements are shaped, sized and/or positioned to compensate for off-axis aberrations in the multi-beam.

Clause 3. The assembly of clause 2, wherein the apertures shaped, sized and/or positioned to compensate for off-axis aberrations in the multi-beam are apertures defined in at least, preferably in only, the planar element that is configured to provide the strongest lensing effect in the objective lens array assembly.

Clause 4: The assembly of any preceding clause, wherein at least a subset of the apertures have a range of different aperture areas, the range of different aperture areas being selected to compensate for off-axis aberrations in the multi-beam, preferably the subset of apertures are defined in one or more planar elements, preferably the same planar element.

Clause 5: The assembly of clause 4, wherein the off-axis aberrations compensated for by the range of different aperture areas comprise field curvature.

Clause 6: The assembly of any preceding clause, wherein at least a subset of the apertures have a range of different ellipticities, the range of different ellipticities being selected to compensate for off-axis aberrations in the multi-beam, preferably the at least a subset of apertures are defined in one or more planar elements, preferably the same planar element.

Clause 7: The assembly of clause 6, wherein the off-axis aberrations compensated for by the range of different ellipticities comprise astigmatism.

Clause 8: The assembly of any preceding clause, wherein at least a subset of the apertures are displaced relative to nominal positions, the displacements being selected to compensate for off-axis aberrations in the multi-beam, preferably the at least a subset of apertures are defined in one or more planar elements, preferably the same planar element.

Clause 9: The assembly of clause 8, wherein the nominal positions are on a regular grid preferable the regular grid is common to a plurality of the planar elements.

Clause 10: The assembly of clause 9, wherein the regular grid comprises a rectangular grid such as a square grid, or a hexagonal grid.

Clause 11: The assembly of any of clauses 8-10, wherein the off-axis aberrations compensated for by the displacements comprise distortion caused by telecentricity error.

Clause 12: The assembly of any preceding clause, wherein at least a subset of the apertures configured to compensate for off-axis aberrations in the multi-beam are apertures defined in one or more planar elements of the objective lens array preferably the subset of apertures are defined in one or more planar elements, preferably the same planar element.

Clause 13: The assembly of any preceding clause, wherein the planar elements further comprise a control lens array positioned up-beam of the objective lens array, the control lenses being configured to pre-focus the sub-beams.

Clause 14: The assembly of clause 13, wherein the planar elements further comprise an upper beam limiter up-beam from the control lens array, wherein the upper beam limiter defines an array of beam-limiting apertures.

Clause 15: The assembly of clause 13 or 14, wherein at least a subset of the apertures defined in the control lens array are provided at positions that are displaced relative to nominal positions, the displacements being selected to compensate for off-axis aberrations in the multi-beam, preferably the subset of apertures are defined in one or more planar elements, preferably the same planar element, preferably the nominal positions are on a regular grid preferable the regular grid is common to a plurality of the planar elements.

Clause 16: The assembly of clause 13 or 14, wherein at least a subset of the apertures defined in the control lens array and upper beam limiter are provided at positions that are displaced relative to nominal positions, the displacements being selected to compensate for off-axis aberrations in the multi-beam, preferably the subset of apertures are defined in one or more planar elements, preferably the same planar element.

Clause 17: The assembly of any of clauses 8-16, wherein the displacements are selected such that sub-beam paths passing through the centers of apertures in the planar element providing the strongest lensing effect will also have passed through centers of corresponding displaced apertures upbeam.

Clause 18: The assembly of any preceding clause, wherein the planar elements comprise a beam shaping limiter down-beam from at least one planar element forming the objective lens array, the beam shaping limiter defining an array of beam-limiting apertures.

Clause 19: The assembly of clause 18, wherein at least a subset of the beam-limiting apertures defined in the beam shaping limiter are provided at positions that are displaced relative to respective central axes of apertures in up-beam planar elements forming the objective lens array, preferably the displacements being selected to compensate for off-axis aberrations in the multi-beam, preferably the subset of apertures are defined in one or more planar elements, preferably the same planar element.

Clause 20: The assembly of clause 19, wherein the off-axis aberrations compensated for by the displacements comprise coma.

Clause 21: The assembly of any preceding clause, further comprising a detector configured to detect charged particles emitted from the sample, at least portion of the detector preferably being adjacent to and/or integrated with the objective lens array, preferably the detector providing a sample facing surface of the assembly.

Clause 22: An objective lens array assembly for an electron-optical system of a charged-particle tool, the objective lens array assembly being configured to focus a multi-beam of sub-beams on a sample and comprising an objective lens array configured to project the multi-beam towards a sample, the objective lens array assembly comprising planar elements defining a plurality of apertures aligned along the sub-beam paths of the multi-beam, wherein an array of the apertures defined in one or more of the planar elements is configured to compensate for off-axis aberrations in the multi-beam.

Clause 23: The objective lens array assembly of any preceding claim, wherein the off-axis aberrations comprise at least one of telecentricity error, field curvature, stigmatism and coma Clause 24: An electron-optical system comprising the objective lens array assembly of any preceding clause.

Clause 25: The system of clause 24, further comprising a collimator up-beam of the objective lens array assembly.

Clause 26: The system of clause 25, wherein the collimator comprises a macro collimator configured to apply a macroscopic collimation to the beam.

Clause 27: The system of any of clauses 24-26, further comprising a condenser lens array upbeam of the objective lens array assembly, the condenser lens array being preferably configured to generate the multi-beam.

Clause 28: The system of clause 27, wherein the condenser lenses in the condenser lens array are configured to form respective intermediate focuses between the condenser lens array and respective objective lenses in the objective lens array assembly, preferably such that the sub-beam paths diverge with respect to each other between the condenser lens array and the intermediate focuses.

Clause 29: The system of clause 27 or 28, wherein condenser lens array is configured to displace positions of at least a subset of sub-beams at the objective lens array relative to nominal positions of the sub-beams, the displacements being selected to correct for off-axis aberrations in the multi-beam, preferably the subset of apertures are defined in one or more planar elements, preferably the same planar element, preferably the nominal positions are on a regular grid preferable the regular grid is common to a plurality of the planar elements Clause 30: The system of clause 29, wherein the displacements of the sub-beams are at least partially implemented by providing respective condenser lenses at positions in the condenser lens array that are displaced relative to nominal positions of the condenser lenses.

Clause 31: The system of clause 29 or 30, further comprising one or more deflectors configured to at least partially implement the displacements of the sub-beams.

Clause 32 The system of any of clauses 29-31, wherein the off-axis aberrations corrected for by the displacements comprise distortion caused by telecentricity error.

Clause 33: The system of any of clauses 24-32, wherein at least a subset of apertures defined in at least one of the planar elements forming the objective lens array are provided at positions that are displaced relative to nominal positions, the displacements being selected to compensate for off-axis aberrations in the multi-beam, preferably the nominal positions are on a regular grid preferable the regular grid is common to a plurality of the planar elements.

Clause 34: The system of clause 33, wherein apertures are displaced relative to the nominal positions in at least, preferably in only, the planar element that is configured to provide the strongest lensing effect in the objective lens array.

Clause 35: The system of clause 33 or 34, wherein the off-axis aberrations compensated for by the displacements comprise coma.

Clause 36: The system of any of clauses 24-35, configured so that the multi-beam passes through only a centrally located subset of the apertures defined in the planar elements.

Clause 37: The system of any of clauses 24-36, further comprising a source configured to provide a beam of charged particles from which the multi-beam is derived.

Clause 38: An electron-optical system array, comprising: a plurality of the electron-optical systems of any of clauses 24-37, wherein: the electron-optical systems are configured to focus respective multi-beams simultaneously onto different regions of the same sample.

Clause 39: An electron-optical apparatus comprising the system of any of clauses 24 to 37 or the electron optical system array of clause 38.

Clause 40: The apparatus of clause 39 comprising a source configured to provide a beam of charged particles from which a multi-beam is derived or a source for each respective system and configure to provide for a beam of charged particles for the respective system from which a multi-beam is derived.

Clause 41: The apparatus of clause 39 or 40 comprising a stage configured to support a sample, preferably the stage comprises a support configured to support the sample.

Clause 42: A method of focusing a multi-beam of charged particles towards a sample, comprising: providing the objective lens array assembly of any of clauses 1-23; and using the objective lens array to project the sub-beams towards the sample.

Clause 43: A method of focusing a multi-beam of charged particles towards a sample, comprising: providing an objective lens array assembly comprising planar elements defining a plurality of apertures aligned along sub-beam paths of the multi-beam and comprising an objective lens array configured to project the multi-beam towards a sample; and using the apertures defined in one or more of the planar elements to compensate for off-axis aberrations in the multi-beam.

Clause 44: The method of clause 42 or 43, wherein the objective lens array is distorted by electrostatic fields applied in the objective lens array during the projecting of the sub-beams towards the sample and the distortion at least partially compensates for field curvature in the multi-beam.

Clause 45: The method of clause 44, wherein the distortion compensates for a majority of the field curvature in the multi-beam.

Clause 46: The method of clause 44 or 45, wherein at least a subset of the apertures defined in the objective lens array are arranged to have a range of different aperture areas to compensate for field curvature in the multi-beam caused by the distortion of the objective lens array by the electrostatic fields, preferably the subset of apertures are defined in one or more planar elements, preferably the same planar element.

Clause 47: The method of any of clauses 42-46, wherein the multi-beam is made to pass through only a centrally located subset of the apertures defined in the planar elements.

Clause 48: A method of focusing a multi-beam of charged particles towards a sample, comprising: projecting the multi-beam towards a sample using an objective lens array assembly; and compensating for off-axis aberrations in the multi-beam within the objective lens array.

Clause 49: The methods of any of clauses 43 or 48, wherein at least a subset of the apertures have a range of different aperture areas, the range of different aperture areas being selected to compensate for off-axis aberrations in the multi-beam, and/or at least a subset of the apertures have a range of different ellipticities, the range of different ellipticities being selected to compensate for off-axis aberrations in the multi-beam, and/or at least a subset of the apertures are displaced relative to nominal positions, the displacements being selected to compensate for off-axis aberrations in the multi-beam.

The invention claimed is:

1. An electron-optical apparatus for a charged-particle tool, the electron-optical apparatus comprising:
   a source configured to provide a beam of charged particles from which a multi-beam is derived; and
   an objective lens array assembly being configured to focus a multi-beam of sub-beams on a sample and comprising:
   planar elements defining a plurality of apertures aligned along sub-beam paths of the multi-beam and comprising:
   an objective lens array configured to project the multi-beam towards a sample; and
   a control lens array positioned up-beam of the objective lens array, the control lenses being configured to pre-focus the sub-beams,
   wherein apertures of one or more of the planar elements are configured to compensate for off-axis aberrations in the multi-beam, at least a subset of the apertures have a range of different aperture areas, the range of different aperture areas being selected to compensate for off-axis aberrations in the multi-beam, and
   wherein at least a subset of the apertures defined in the control lens array are provided at positions that are displaced relative to nominal positions, the displacements being selected to compensate for off-axis aberrations in the multi-beam.

2. The electron-optical apparatus of claim 1, wherein apertures of one or more of the planar elements are shaped, sized and/or positioned to compensate for off-axis aberrations in the multi-beam.

3. The electron-optical apparatus of claim 2, wherein apertures shaped, sized and/or positioned to compensate for off-axis aberrations in the multi-beam are apertures defined in at least the planar element that is configured to provide the strongest lensing effect in the objective lens array assembly.

4. The electron-optical apparatus of claim 1, wherein the off-axis aberrations compensated for by the range of different aperture areas comprise field curvature.

5. The electron-optical apparatus of claim 1, wherein at least a subset of the apertures have a range of different ellipticities, the range of different ellipticities being selected to compensate for off-axis aberrations in the multi-beam.

6. The electron-optical apparatus of claim 1, wherein at least a subset of the apertures are displaced relative to nominal positions, the displacements being selected to compensate for off-axis aberrations in the multi-beam.

7. The electron-optical apparatus of claim 1, wherein at least a subset of the apertures configured to compensate for off-axis aberrations in the multi-beam are apertures defined in one or more planar elements of the objective lens array.

8. The electron-optical apparatus of claim 1, wherein the planar elements further comprise an upper beam limiter up-beam from the control lens array, wherein the upper beam limiter defines an array of beam-limiting apertures.

9. The electron-optical apparatus of claim 8, wherein at least a subset of the apertures defined in the control lens array and upper beam limiter are provided at positions that are displaced relative to nominal positions, the displacements being selected to compensate for off-axis aberrations in the multi-beam.

10. The electron-optical apparatus of claim 6, wherein the displacements are selected such that sub-beam paths passing through the centers of apertures in the planar element providing the strongest lensing effect will also have passed through centers of corresponding displaced apertures upbeam.

11. The electron-optical apparatus of claim 1, wherein the planar elements comprise a beam shaping limiter down-beam from at least one planar element forming the objective lens array, the beam shaping limiter defining an array of beam-limiting apertures.

12. The electron-optical apparatus of claim 11, wherein at least a subset of the beam-limiting apertures defined in the beam shaping limiter are provided at positions that are displaced relative to respective central axes of apertures in up-beam planar elements forming the objective lens array.

13. The electron-optical apparatus of claim 1, further comprising a detector configured to detect charged particles emitted from the sample.

14. The electron-optical apparatus of claim 1, further comprising a collimator up-beam of the objective lens array assembly.

15. An electron-optical apparatus for a charged-particle tool the electron-optical apparatus comprising:

a source configured to provide a beam of charged particles from which a multi-beam is derived;

a stage configured to support a sample, the stage comprises a support configured to support the sample; and an objective lens array assembly configured to focus a multi-beam of sub-beams on a sample and comprising:

an objective lens array configured to project the multi-beam towards a sample; and a control lens array positioned up-beam of the objective lens array, the control lenses being configured to pre-focus the sub-beams, the objective lens array assembly comprising planar elements defining a plurality of apertures aligned along sub-beam paths of the multi-beam, wherein an array of the apertures defined in one or more of the planar elements is configured to compensate for off-axis aberrations in the multi-beam, at least a subset of the apertures have a range of different aperture areas, the range of different aperture areas being selected to compensate for off-axis aberrations in the multi-beam, and wherein at least a subset of the apertures defined in the control lens array are provided at positions that are displaced relative to nominal positions, the displacements being selected to compensate for off-axis aberrations in the multi-beam.

16. The objective lens array assembly of claim 15, wherein the off-axis aberrations comprise at least one of telecentricity error, field curvature, stigmatism and coma.

17. A method of focusing a multi-beam of charged particles towards a sample, comprising:

providing an objective lens array assembly comprising planar elements defining a plurality of apertures aligned along sub-beam paths of the multi-beam and comprising:

an objective lens array configured to project the multi-beam towards a sample; and a control lens array positioned up-beam of the objective lens array, the control lenses being configured to pre-focus the sub-beams;

using the apertures defined in one or more of the planar elements to compensate for off-axis aberrations in the multi-beam, at least a subset of the apertures have a range of different aperture areas, the range of different aperture areas being selected to compensate for off-axis aberrations in the multi-beam; and using at least a subset of the apertures defined in the control lens array are provided at positions that are displaced relative to nominal positions, the displacements being selected to compensate for off-axis aberrations in the multi-beam.

18. The method of claim 17, wherein the objective lens array is distorted by electrostatic fields applied in the objective lens array during the projecting of the sub-beams towards the sample and the distortion at least partially compensates for field curvature in the multi-beam.

\* \* \* \* \*